(12) United States Patent
Watanabe et al.

(10) Patent No.: US 11,239,317 B2
(45) Date of Patent: Feb. 1, 2022

(54) SEMICONDUCTOR MEMORY DEVICE CAPABLE OF SUPPRESSING LEAKAGE CURRENT

(71) Applicant: Kioxia Corporation, Minato-ku (JP)

(72) Inventors: Shoichi Watanabe, Kawasaki (JP); Mitsuhiro Noguchi, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/807,230

(22) Filed: Mar. 3, 2020

(65) Prior Publication Data

US 2021/0074811 A1 Mar. 11, 2021

(30) Foreign Application Priority Data

Sep. 9, 2019 (JP) .............................. JP2019-163798

(51) Int. Cl.
*H01L 29/08* (2006.01)
*H01L 27/092* (2006.01)
(Continued)

(52) U.S. Cl.
CPC .......... *H01L 29/0847* (2013.01); *G11C 16/30* (2013.01); *H01L 21/823418* (2013.01); *H01L 21/823814* (2013.01); *H01L 21/823828* (2013.01); *H01L 27/0922* (2013.01); *H01L 27/11573* (2013.01); *H01L 29/34* (2013.01)

(58) Field of Classification Search
CPC . H01L 29/42324–42328; H01L 29/788–7888; H01L 27/11517–11582; H01L 29/0843–0886; H01L 21/823828; H01L 21/823814; H01L 21/823418
See application file for complete search history.

(56) References Cited

U.S. PATENT DOCUMENTS 4,782,029 A * 11/1988 Takemura ............. H01L 21/268
257/E21.239
8,716,097 B2 5/2014 Bordelon, Jr. et al.
(Continued)

FOREIGN PATENT DOCUMENTS

JP 10-214970 A 8/1998
JP 11-168211 A 6/1999

*Primary Examiner* — Sonya McCall-Shepard
(74) *Attorney, Agent, or Firm* — Oblon, McClelland, Maier & Neustadt, L.L.P.

(57) ABSTRACT

According to a certain embodiment, the nonvolatile semiconductor memory device includes: a first conductivity-type semiconductor substrate including a crushed layer on a back side surface thereof; a memory cell array disposed on a front side surface of the semiconductor substrate opposite to the crushed layer; and a first conductivity-type high voltage transistor HVP disposed on the semiconductor substrate and including a first conductivity-type channel, configured to supply a high voltage to the memory cell array. The first conductivity-type high voltage transistor includes: a well region NW disposed on the surface of the semiconductor substrate and having a second conductivity type; a source region and a drain region disposed in the well region; and a first conductivity-type first high concentration layer WT2 disposed between the crushed layer of the semiconductor substrate and the well region and having a higher concentration than an impurity concentration of the semiconductor substrate.

20 Claims, 25 Drawing Sheets

(51) Int. Cl.
    *H01L 27/11573*     (2017.01)
    *H01L 29/34*     (2006.01)
    *H01L 21/8238*     (2006.01)
    *H01L 21/8234*     (2006.01)
    *H01L 27/11582*     (2017.01)
    *H01L 27/11551*     (2017.01)
    *H01L 27/1157*     (2017.01)
    *H01L 27/11524*     (2017.01)
    *H01L 27/11578*     (2017.01)
    *G11C 16/30*     (2006.01)

(56) References Cited

U.S. PATENT DOCUMENTS

2005/0018489 A1* 1/2005 Hosono .............. G11C 16/3445
                                                                            365/185.29
2011/0062547 A1* 3/2011 Onishi ................ H01L 29/0649
                                                                            257/510

* cited by examiner

SEMICONDUCTOR MEMORY DEVICE CAPABLE OF SUPPRESSING LEAKAGE CURRENT

CROSS REFERENCE TO RELATED APPLICATIONS

This application is based upon and claims the benefit of priority from prior Japanese Patent Application No. P2019-163798 filed on Sep. 9, 2019, the entire contents of which are incorporated herein by reference.

FIELD

Embodiments described herein relate generally to a nonvolatile semiconductor memory device.

BACKGROUND

3-Dimensional (3D) NAND flash memories as nonvolatile semiconductor memory devices have been known. In 3D NAND flash memory chips, since the number of cells to be stacked increases as a generation progresses, the height of NAND flash memory devices formed on a semiconductor substrate also increases accordingly.

Accordingly, it is required to form such semiconductor substrates thinner, in order to form 3D NAND flash memory chips having a thickness within a specified thickness.

DETAILED DESCRIPTION

Next, certain embodiments will now be described with reference to drawings. In the description of the following drawings to be explained, the identical or similar reference sign is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

In the following description, an n channel high voltage MOS transistor HVN, a p channel high voltage MOS transistor HVP, an n channel low voltage MOS transistor LVN, and a p channel low voltage MOS transistor LVP may respectively be simply expressed as an n channel high voltage transistor HVN, a p channel high voltage transistor HVP, an n channel low voltage transistor LVN, and a p channel low voltage transistor LVP. Alternatively, they may respectively be simply expressed as HVN, HVP, LVN, and LVP.

Certain embodiments disclosed herein provide a highly reliable nonvolatile semiconductor memory device capable of suppressing a leakage current of a semiconductor substrate.

According to one embodiment, the nonvolatile semiconductor memory device includes: a first conductivity-type semiconductor substrate including a crushed layer on a back side surface thereof; a memory cell array disposed on a front side surface of the semiconductor substrate opposite to the crushed layer; and a first conductivity-type high voltage transistor disposed on the semiconductor substrate, the first conductivity-type high voltage transistor including a first conductivity-type channel, the first conductivity-type high voltage transistor configured to supply a high voltage to the memory cell array. The first conductivity-type high voltage transistor includes: a well region disposed on the surface of the semiconductor substrate and having a conductivity type which is a second conductivity type opposite to the first conductivity type; a source region and a drain region disposed in the well region; and a first conductivity-type first high concentration layer disposed between the crushed layer of the semiconductor substrate and the well region, the first high concentration layer having a higher concentration than an impurity concentration of the semiconductor substrate.

[Embodiments]
(Memory System)

Figure 1:
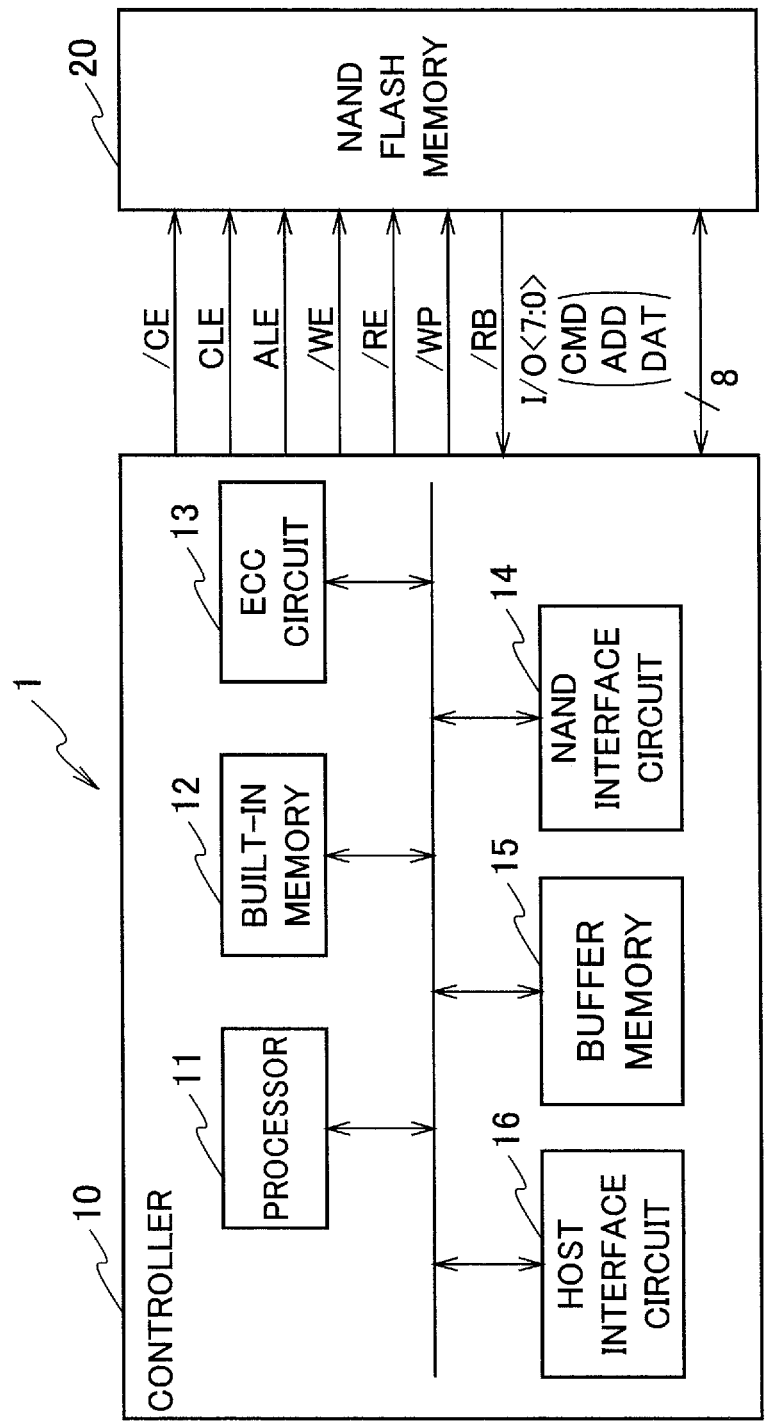
FIG. 1 is a diagram illustrating a block configuration example of a memory system to which a nonvolatile semiconductor memory device according to the embodiments is applied.

FIG. 1 illustrates a block configuration example of a memory system 1 to which a nonvolatile semiconductor memory device 20 according to the embodiments is applied.

The memory system 1 communicates with an external host device(s), for example. The memory system 1 stores data from a host device (not illustrated), and reads out data to the host device.

As illustrated in FIG. 1, the memory system 1 includes a controller 10 and a nonvolatile semiconductor memory device (e.g., a NAND flash memory) 20. The controller 10 receives a command from the host device and controls the nonvolatile semiconductor memory device 20 on the basis of the received command. More specifically, the controller 10 writes data instructed to be written by the host device into the nonvolatile semiconductor memory device 20, and reads data instructed to be read by the host device from the nonvolatile semiconductor memory device 20 and transmits the read data to the host device. The controller 10 is connected to the nonvolatile semiconductor memory device 20 through a NAND bus. The nonvolatile semiconductor memory device 20 includes a plurality of memory cells and stores data in a nonvolatile manner.

The NAND bus transmits and receives signals /CE, CLE, ALE, /WE, /RE, /WP, /RB, and I/O <7:0> according to a NAND interface standard via individual wirings. The signal /CE is a signal for enabling the nonvolatile semiconductor memory device 20. The signal CLE notifies the nonvolatile semiconductor memory device 20 that the signal I/O <7:0> input to the nonvolatile semiconductor memory device 20 includes a command while the signal CLE is at a "H (High)" level. The signal ALE notifies the nonvolatile semiconductor memory device 20 that the signal I/O <7:0> input to the nonvolatile semiconductor memory device 20 includes an address while the signal ALE is at the "H" level. The signal /WE instructs the nonvolatile semiconductor memory device 20 to buffer the signal I/O <7:0> input to the nonvolatile semiconductor memory device 20 while the signal /WE is at a "L (Low)" level. The signal /RE instructs the nonvolatile semiconductor memory device 20 to output the signal I/O <7:0>. The signal /WP instructs the nonvolatile semiconductor memory device 20 to prohibit writing (programing) and erasing of data. The signal /RB indicates whether the nonvolatile semiconductor memory device 20 is in a ready state (e.g., a state where reception of an instruction from the outside is accepted) or a busy state (e.g., a state where reception of an instruction from the outside is not accepted). The signal I/O <7:0> is, for example, an 8-bit signal. The signal I/O <7:0> substance of data transmitted and received between the nonvolatile semiconductor memory device 20 and the controller 10, and may include a command CMD, an address ADD, and data DAT. The data DAT includes write data and read data.

As illustrated in FIG. 1, the controller 10 includes a processor (e.g., Central Processing Unit (CPU)) 11, a built-in memory (e.g., Random Access Memory (RAM)) 12, an Error Check and Correction (ECC) circuit 13, a NAND interface circuit 14, a buffer memory 15, and a host interface circuit 16.

The processor 11 controls the overall operation of the controller 10. The processor 11 issues a read instruction based on the NAND interface standard to the nonvolatile semiconductor memory device 20, for example, in response to a data read instruction received from the host device. This operation also applies to a case of writing and erasing of data. The processor 11 includes a function of executing various operations on read data from the nonvolatile semiconductor memory device 20.

The built-in memory 12 is, for example, a semiconductor memory such as a dynamic RAM (DRAM) and is used as a work area of the processor 11. The built-in memory 12 stores firmware, various management tables, and the like for managing the nonvolatile semiconductor memory device 20.

The ECC circuit 13 executes error detection and error correction processing. More specifically, when data is written, an ECC code is generated for each set including a certain number of pieces of data on the basis of data received from the host device. When data is read out, ECC decoding is executed on the basis of the ECC code to detect the presence or absence of an error. Moreover, when an error is detected, a bit position where the error is detected is specified to correct the error.

The NAND interface circuit 14 is connected to the nonvolatile semiconductor memory device 20 through the NAND bus, and manages communication with the nonvolatile semiconductor memory device 20. In response to an instruction of the processor 11, the NAND interface circuit 14 transmits the command CMD, the address ADD, and write data to the nonvolatile semiconductor memory device 20. The NAND interface circuit 14 also receives read data from the nonvolatile semiconductor memory device 20.

The buffer memory 15 temporarily stores data and the like received by the controller 10 from the nonvolatile semiconductor memory device 20 and the host device. The buffer memory 15 is also used, for example, as a storage area for temporarily stores read data from the nonvolatile semiconductor memory device 20, an operation result on read data, and the like.

The host interface circuit 16 is connected to the host device and manages the communication with the host device. The host interface circuit 16 transfers respectively, for example, an instruction and data received from the host device to the processor 11 and the buffer memory 15.

(Configuration of Nonvolatile Semiconductor Memory Device)

Figure 2:
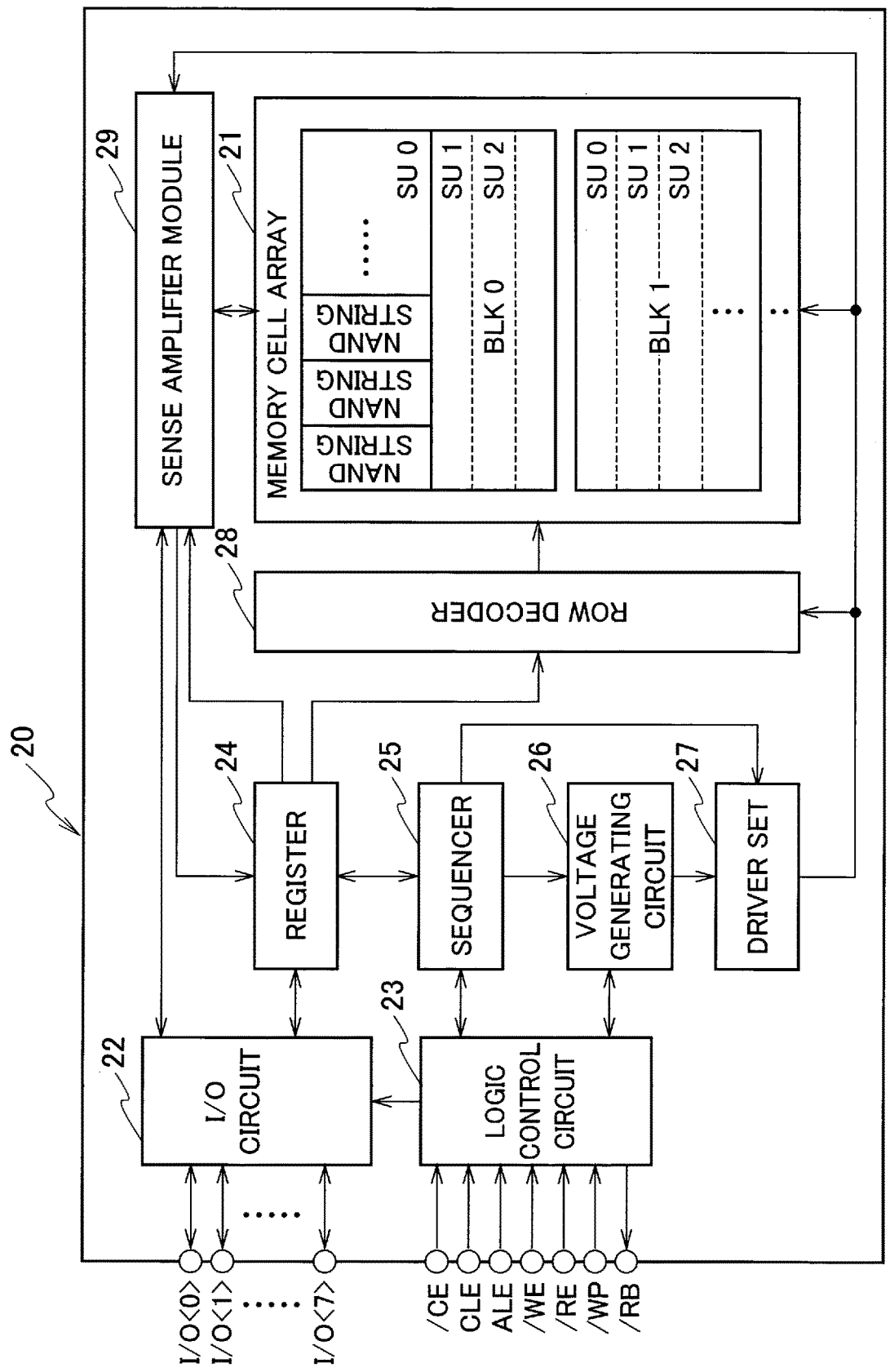
FIG. 2 is a diagram illustrating a block configuration example of the nonvolatile semiconductor memory device according to the embodiments.

As illustrated in FIG. 2, the nonvolatile semiconductor memory device 20 according to the embodiments includes a memory cell array 21, an input/output (I/O) circuit 22, a logic controller 23, a register 24, a sequencer 25, a voltage generating circuit 26, a driver set 27, a row decoder 28, and a sense amplifier module 29.

The memory cell array 21 includes a plurality of blocks BLK (BLK0, BLK1, . . . ). The block BLK includes a plurality of nonvolatile memory cell transistors associated with word lines and bit lines. The block BLK is an erasing unit of data, and data in the same block BLK is collectively erased, for example. Each block BLK includes a plurality of string units SU (SU0, SU1, SU2, . . . ). Each string unit SU is a set including NAND strings NS. The NAND string NS includes a plurality of memory cell transistors. Hereinafter, the memory cell transistor may also be simply referred to as a "cell." The number of blocks in the memory cell array 21, the number of string units in one block BLK, and the number of NAND strings in one string unit SU can be set to any number.

The input and output circuit 22 transmits and receives the signal I/O <7:0> to and from the controller 10. The input and output circuit 22 transfers the command CMD and the address ADD in the signal I/O <7:0> to the register 24. The input and output circuit 22 transmits and receives write data and read data to and from the sense amplifier module 29.

The logic control circuit 23 receives the signals /CE, CLE, ALE, /WE, /RE, and /WP from the controller 10. The logic control circuit 23 transfers the signal /RB to the controller 10 and notifies a state of the nonvolatile semiconductor memory device 20 to the outside.

The register 24 stores the command CMD and the address ADD. The register 24 transfers the address ADD to the row decoder 28 and the sense amplifier module 29 and transfers the command CMD to the sequencer 25.

The sequencer 25 receives the command CMD and controls the entire nonvolatile semiconductor memory device 20 in accordance with a sequence based on the received command CMD.

The voltage generating circuit 26 generates a voltage necessary for operations such as writing, reading, and erasing of data on the basis of an instruction from the sequencer 25. The voltage generating circuit 26 supplies the generated voltage to the driver set 27.

The driver set 27 includes a plurality of drivers and supplies various voltages from the voltage generating circuit 26 to the row decoder 28 and the sense amplifier module 29 on the basis of the address from the register 24. The driver set 27 supplies various voltages to the row decoder 28 on the basis of a row address in the address, for example.

The row decoder 28 receives the row address in the address ADD from the register 24, and selects the block ELK or the like on the basis of a block address in the aforementioned row address, for example. The voltage from the driver set 27 is transferred to the selected block BLK through the row decoder 28.

When reading data, the sense amplifier module 29 senses the read data which is read from the memory cell transistor to the bit line, and transfers the sensed read data to the I/O circuit 22. When writing data, the sense amplifier module 29 transfers the write data to be written through the bit lines to the memory cell transistor. The sense amplifier module 29 receives a column address in the address ADD from the register 24, and outputs column data based on the column address.

(Circuit Configuration Example of Memory Cell Array)

Figure 3:
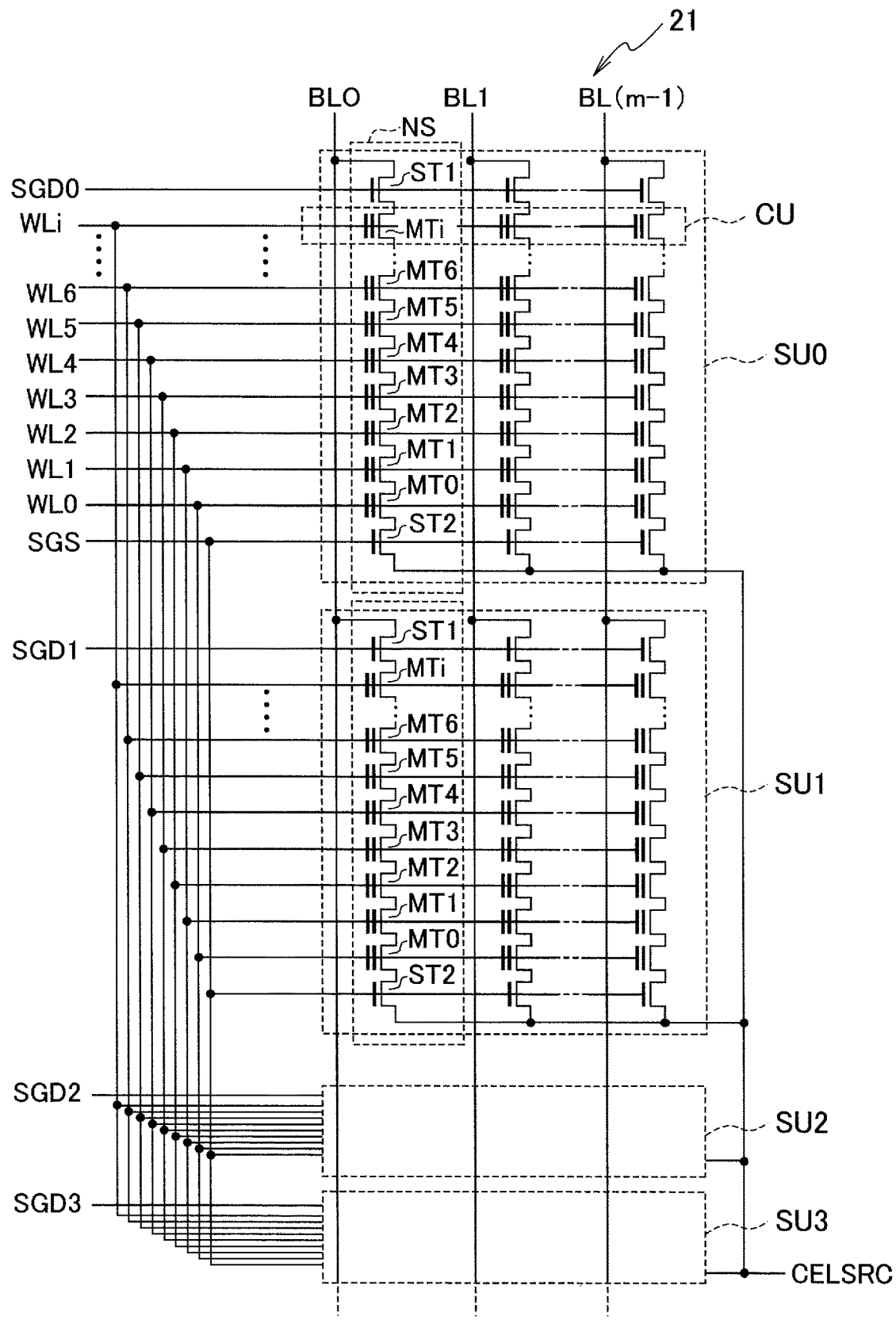
FIG. 3 is a diagram illustrating a circuit configuration example of a memory cell array in the nonvolatile semiconductor memory device according to the embodiments.

FIG. 3 illustrates a circuit configuration example of a memory cell array 21 in the nonvolatile semiconductor memory device 20 according to the embodiments. As illustrated in FIG. 3, each of the NAND strings NS includes, for example, i (where i is a natural number) pieces of memory cell transistors MT (MT0 to MTi), a select transistor ST1, and a select transistor ST2. The number i of the memory cell transistors MT may be, for example, 8, 16, 32, 64, 96, 128 or the like, and the number thereof is not limited thereto. The memory cell transistor MT includes a stacked gate structure including a control gate and a charge storage layer. Moreover, the memory cell transistor MT may include a stacked gate structure including a control gate and a floating gate. Each memory cell transistor MT is connected in series between the select transistors ST1 and ST2. In the following description, the term "connection" also includes a case where another electrically conductive element is interposed between elements.

In a certain block BLK, gates of the select transistors ST1 of string units SU0 to SU3 are respectively connected to select gate lines SGD0 to SGD3. Moreover, gates of the select transistors ST2 of all the string units SU in the block BLK are commonly connected to a select gate line SGS. Control gates of the memory cell transistors MT0 to MTi in the same block BLK respectively are connected to the word lines WL0 to WLi. That is, the word line WL of the same address is commonly connected to all the string units SU in the same block BLK, and the select gate line SGS is commonly connected to all the string units SU in the same block BLK. On the other hand, a select gate line SGD is connected to only one of the string units SU in the same block BLK.

Among the NAND strings NS arranged in a matrix in the memory cell array 21, the other end of the select transistor ST1 of the NAND string NS in the same row is connected to one of m bit lines BL (BL0 to BL (m-1) (where m is a natural number)). Moreover, the bit line BL is commonly connected to the NAND string NS of the same column across the plurality of blocks BLK.

Moreover, the other end of the select transistor ST2 is connected to a source line CELSRC. The source line CELSRC is commonly connected to the plurality of NAND strings NS across the plurality of blocks BLK.

Data erasing is executed collectively with respect to the memory cell transistors MT in the same block BLK. In contrast, reading and writing of data are executed collectively with respect to the plurality of memory cell transistors MT commonly connected to any of the word lines WL, in any of the string units SU of any block BLK. Such a set including memory cell transistors MT sharing the word line WL in one string unit SU is referred to as a cell unit CU. The cell unit CU is a set including the memory cell transistors MT for which write operations or read operations can be collectively executed.

In addition, one memory cell transistor MT can store a plurality of pieces of bit data, for example. In the same cell unit CU, a set including one bit held at the same bit position by each memory cell transistor MT is called a "page." The "page" is defined as a portion of memory space formed in a set including the memory cell transistors MT in the same cell unit CU.

(Example of Cross-Sectional Structure of Memory Cell Array)

Figure 4:
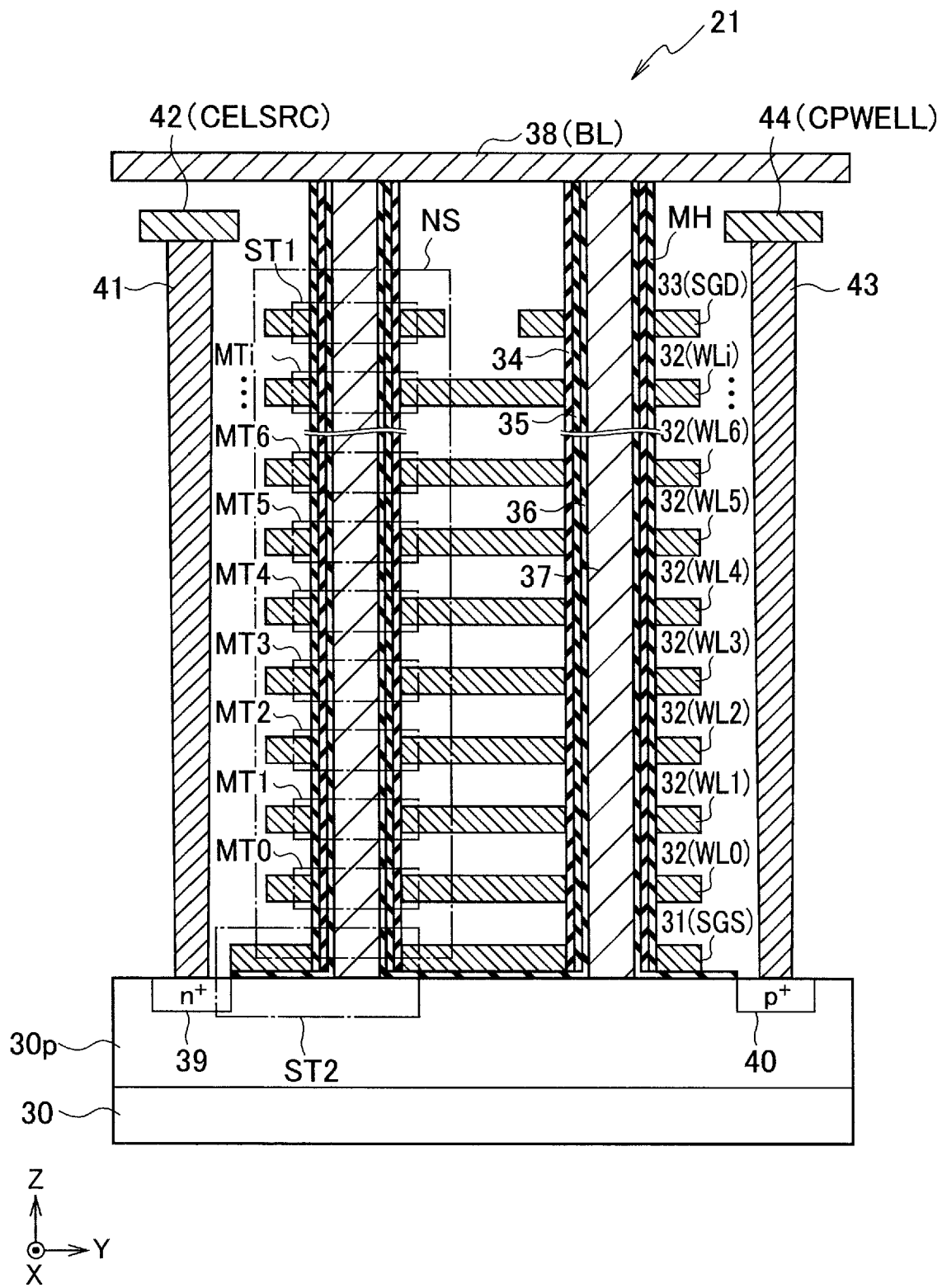
FIG. 4 is a diagram illustrating an example of a cross-sectional structure of the memory cell array in the nonvolatile semiconductor memory device according to the embodiments.

FIG. 4 illustrates an example of a cross-sectional structure of the memory cell array 21 in the nonvolatile semiconductor memory device 20 according to the embodiments. FIG. 4 illustrates the portions relating to two string units SU0 and SU1 in one block BLK. Specifically, FIG. 4 illustrates two NAND strings NS of each of the two string units SU0 and SU1, and peripheral portions thereof. A plurality of configurations of the NAND string NS illustrated in FIG. 4 are arranged in an X-direction and a Y-direction. For example, a set including a plurality of NAND strings NS aligned in the X-direction corresponds to one string unit SU.

The memory cell array 21 is provided on a semiconductor substrate 30. A plane parallel to a surface of the semiconductor substrate 30 is defined as an XY plane, and a direction perpendicular to the XY plane is defined as a Z-direction. Further, the X-direction and the Y-direction are orthogonal to each other.

A p type well region 30p is disposed above the semiconductor substrate 30. As illustrated in FIG. 4, a plurality of NAND strings NS are disposed on the p type well region 30p. More specifically, on the p type well region 30p, a wiring layer 31 functioning as the select gate line SGS, i+1 wiring layers 32 (WL0 to WLi) functioning as word lines WL0 to WLi, and a wiring layer 33 functioning as the select gate line SGD are sequentially stacked, for example. A plurality of wiring layers 31 and 33 may be stacked thereon. An insulating layer (not illustrated) is disposed between the stacked wiring layers 31 to 33.

The wiring layer 31 is commonly connected to the gates of the respective select transistors ST2 of the plurality of NAND strings NS in one block BLK, for example. The wiring layer 32 is commonly connected to control gates of the respective memory cell transistors MT of the plurality of NAND strings NS in one block BLK, for each layer. The wiring layer 33 is commonly connected to the gates of the respective select transistors ST1 of the plurality of NAND strings NS in one string unit SU.

A memory hole MH is disposed so as to pass through the wiring layers 33, 32, and 31 and to reach the p type well region 30p. On the side surface of the memory hole MH, a block insulating layer 34, a charge storage layer(e.g., insulating layer) 35, and a tunnel oxide layer 36 are sequentially disposed in this order from outside. A semiconductor pillar (e.g., conductive layer) 37 is embedded in the memory hole MH. The semiconductor pillar 37 is non-doped polysilicon, for example, and functions as a current path of the NAND string NS. On a top edge of the semiconductor pillar 37, a wiring layer 38 functioning as a bit line BL is disposed.

As described above, the select transistor ST2, the plurality of memory cell transistors MT, and the select transistor ST1 are sequentially stacked on the upper side of the p type well region 30p, and one memory hole MH corresponds to one NAND string NS.

An $n^+$ type impurity diffusion region 39 and a $p^+$ type impurity diffusion region 40 are disposed on an upper portion of the p type well region 30p. A contact plug 41 is disposed on an upper surface of the $n^+$ type impurity diffusion region 39. On an upper surface of the contact plug 41, a wiring layer 42 functioning as a source line CELSRC is disposed. A Contact plug 43 is disposed on an upper surface of the p+ type impurity diffusion region 40. On an upper surface of the contact plug 43, a wiring layer 44 functioning as a well line CPWELL is disposed.

A detailed structure of the memory cell array 21 of a nonvolatile semiconductor memory device 20 according to the embodiments and the semiconductor substrate 30 which forming a peripheral circuit thereof will be described in first to sixth embodiments.

(Configuration of Row Decoder)

Figure 5A:
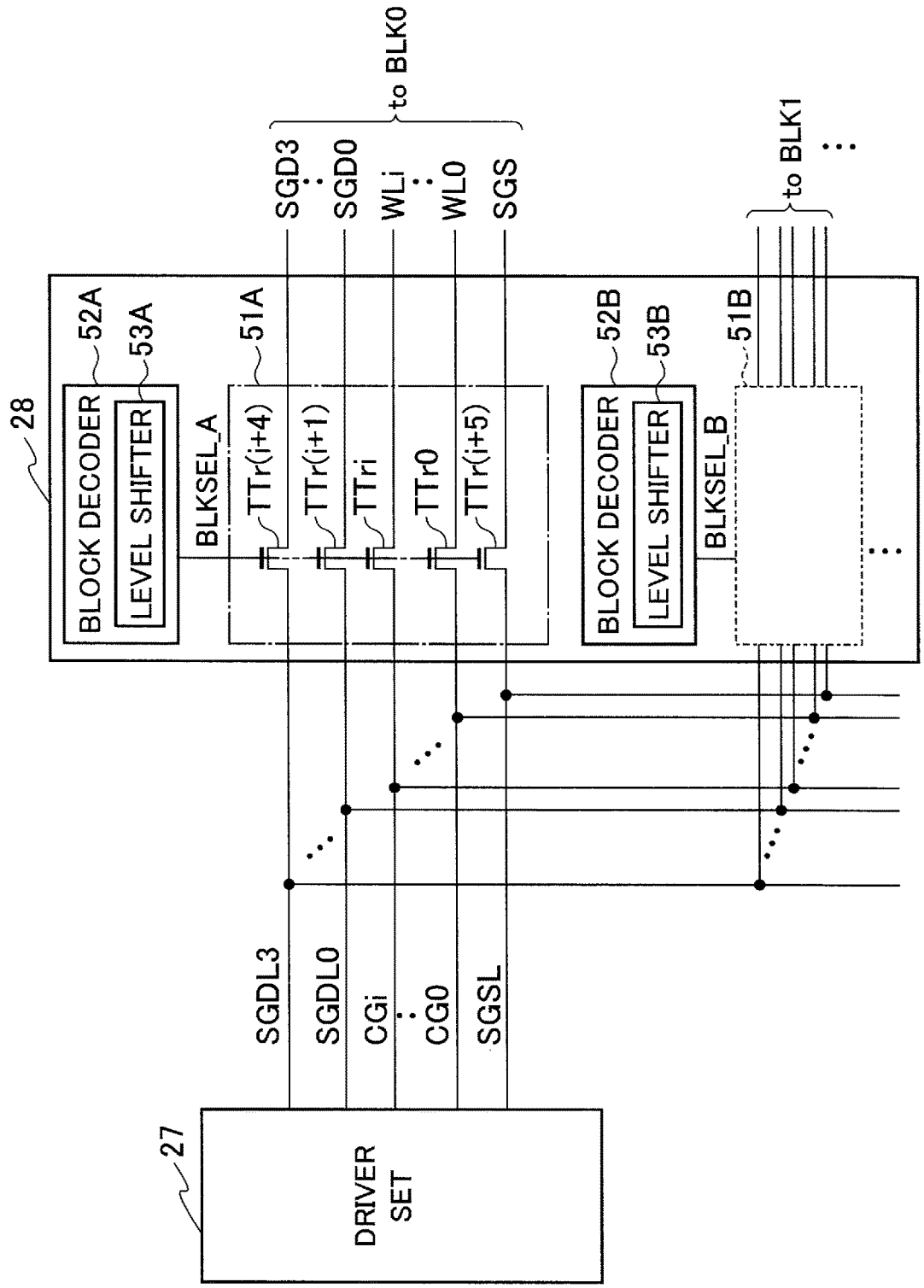
FIG. 5A is a diagram illustrating a block configuration example of a row decoder in the nonvolatile semiconductor memory device according to the embodiments.

FIG. 5A illustrates a block configuration example of the row decoder 28 in the nonvolatile semiconductor memory device according to the embodiments.

As illustrated in FIG. 5A, the row decoder 28 includes a plurality of transfer switch groups 51 (51A, 51B, . . . ) and a plurality of block decoders 52 (52A, 52B, . . . ).

One transfer switch group 51 and one block decoder 52 are allocated to one block BLK, for example. In the example of FIG. 5A, a transfer switch group 51A and a block decoder 52A are allocated to a block BLK0, and a transfer switch group 51B and a block decoder 52B are allocated to a block BLK1. In the following description, a block BLK which is to be written, read, and erased is referred to as a "selected block BLK", and a block BLK except for the selected block BLK is referred to as a "non-selected block BLK."

Moreover, in the following description, when distinguishing between a node corresponding to the transfer switch group 51A and the block decoder 52A, and a node corresponding to the transfer switch group 51B and the block decoder 52B, "_A", "_B", and the like are respectively added to the ends of the reference numerals to distinguish the transfer switch groups and the block decoders. For example, a selected block node BLKSEL connecting between the transfer switch group 51A and the block decoders 52A is referred to as a selected block node BLKSEL_A, and a selected block node BLKSEL connecting between the transfer switch group 51B and the block decoders 52B is referred to as a selected block node BLKSEL_B. Note that when particularly not distinguishing between the selected block node corresponding to the transfer switch group 51A and the block decoder 52A, and the selected block node corresponding to the transfer switch group 51B and the block decoder 52B, such "_A", "_B", and the like are not respectively added to the ends of the reference numerals.

The transfer switch group 51 includes (i+6) pieces of the transfer transistors TTr (TTr0 to TTr(i+5)), for example.

The transfer transistor TTr0 to TTri respectively transfer voltages, which are supplied from the driver set 27 to the wirings CG (CG0 to CGi), to the word lines WL0 to WLi of the selected block BLK. The transfer transistors TTr0 to TTri respectively include a first end connected to the word lines WL0 to WLi of the corresponding block BLK, a second end connected to the wirings CG0 to CGi, and a gate commonly connected to the selected block node BLKSEL.

The transfer transistors TTr(i+1) to TTr(i+4) respectively transfer voltages, which are supplied from the driver set 27 to the wirings SGDL (SGDL0 to SGDL3), to the select gate lines SGD0 to SGD3 of the selected block BLK. The transfer transistors TTr(i+1) to TTr(i+4) respectively include a first end connected to the select gate lines SGD0 to SGD3 of the corresponding block BLK, a second end connected to the wirings SGDL0 to SGDL3, and a gate commonly connected to the selected block node BLKSEL.

The transfer transistor TTr(i+5) transfers a voltage, which is supplied from the driver set 27 to the wiring SGSL, to the select gate line SGS of the selected block BLK. The transfer transistor TTr(i+5) includes a first end connected to the select gate line SGS of the corresponding block BLK, a second end connected to the wiring SGSL, and a gate connected to the selected block node BLKSEL.

The block decoder 52 decodes a block address signal received from the register 24 at the time of writing, reading, and erasing of data. The block decoder 52 outputs a signal of High (H) level to the selected block node BLKSEL, when it is determined that a block BLK corresponding to the block decoder 52 is the selected block BLK, as a result of the decoding.

On the other hand, the block decoder 52 outputs a signal of Low (L) level to the selected block node BLKSEL, when it is determined that a block BLK corresponding thereto is not the selected block BLK. The signal which is output to the selected block node BLKSEL turns an ON state the transfer transistors TTr0 to TTr(i+5) at the High (H) level, and turns an OFF state the transfer transistors TTr0 to TTr(i+5) at the Low (L) level.

Moreover, for example, when an abnormality have occurred in the selected block BLK (such that it is a bad block), the block decoder 52 can set the signal to be output to the selected block node BLKSEL to the L level on the basis of information stored therein.

Accordingly, for example, in the transfer switch group 51 corresponding to the selected block BLK, when the selected block BLK is normal, the transfer transistors TTr0 to TTr(i+5) are turned to the ON state. Consequently, the word lines WL0 to WLi are respectively connected to the wirings CG0 to CGi, the select gate lines SGD0 to SGD3 are respectively connected to the wirings SGDL0 to SGDL3, and the select gate line SGS is connected to the wiring SGSL.

On the other hand, in the transfer switch group 51 corresponding to the selected block BLK, when the selected block BLK is a bad block, the transfer transistors TTr0 to TTr(i+5) are turned to the OFF state. Consequently, the word line WL is electrically disconnected from the wiring CG, and the select gate lines SGD and SGS respectively are electrically disconnected from the wirings SGDL and SGSL.

Moreover, in the transfer switch group 51 corresponding to the non-selected block BLK, the transfer transistors TTr0 to TTr(i+5) are in the OFF state irrespective of whether or not the non-selected block BLK is a bad block. Consequently, the word line WL is electrically disconnected from the wiring CG, and the select gate lines SGD and SGS are electrically disconnected from the wirings SGDL and SGSL, respectively.

The driver set 27 supplies voltages to the wirings CG, SGDL, and SGSL in accordance with the address ADD received from the register 24. The wirings CG, SGDL and SGSL transfer various voltages supplied from the driver set 27 to each of the transfer switch groups 51A, 51B, . . . . That is, the voltage supplied from the driver set 27 is transferred to the word line WL, and the select gate lines SGD and SGS in the selected block BLK, via the transfer transistors TTr0 to TTr(i+5) in the transfer switch group 51 corresponding to the selected block BLK.

(Level Shifter)

Figure 6A:
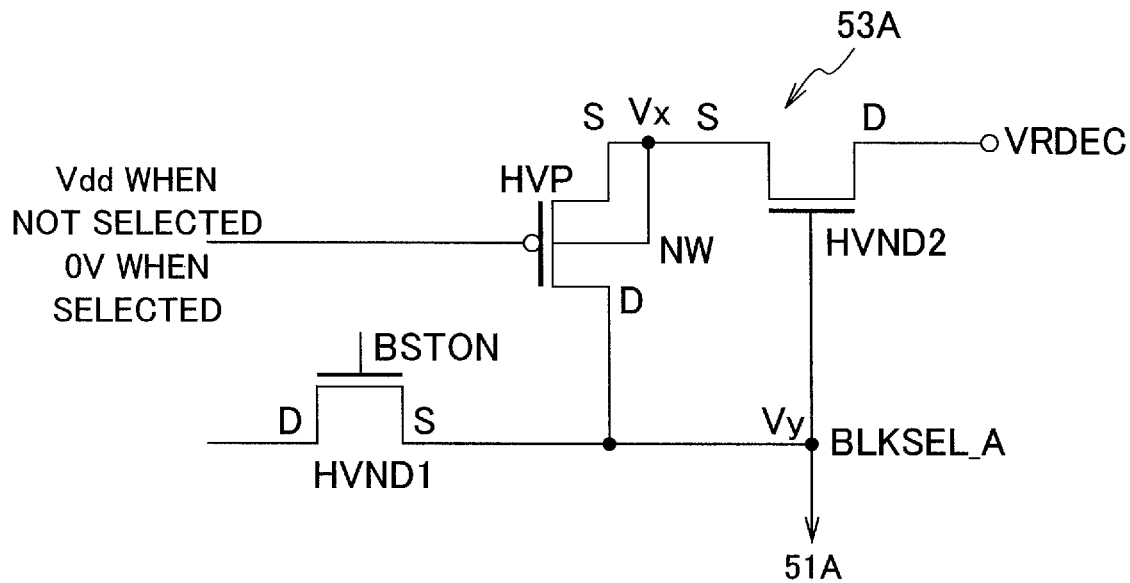
FIG. 6A is a diagram illustrating a circuit configuration example of a level shifter to be applied to the nonvolatile semiconductor memory device according to the embodiments.
Figure 6B:
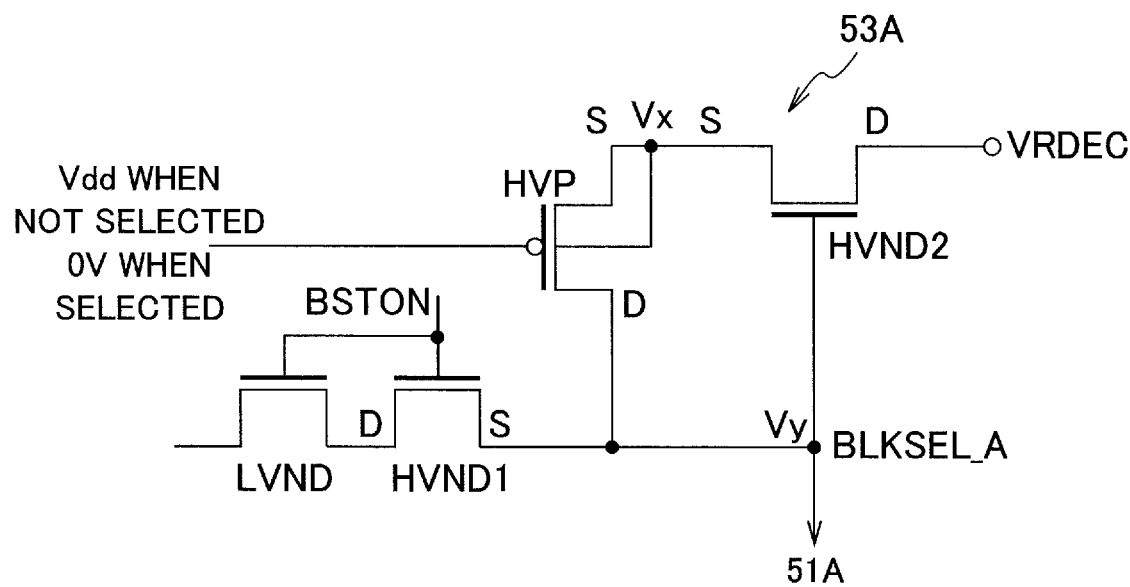
FIG. 6B is a diagram illustrating another circuit configuration example of the level shifter to be applied to the nonvolatile semiconductor memory device according to the embodiments.

FIG. 6A illustrates a circuit configuration example of a level shifter 53A to be applied to the nonvolatile semiconductor memory device according to the embodiments, and FIG. 6B illustrates another circuit configuration example of the level shifter.

As illustrated in FIG. 6A, the level shifter 53A to be applied to the nonvolatile semiconductor memory device according to the embodiments includes: a p channel high voltage MOS transistor HVP; an n channel high voltage MOS transistor HVND2 of which a source is connected to a source S and an n type well NW of the HVP; and an n channel high voltage MOS transistor HVND1 of which a source is connected to a drain of the HVP. In the circuit configuration of FIG. 6B, an n channel low voltage MOS transistor LVND is connected to the n channel high voltage MOS transistor HVND1 in series, but the rest of the configuration is the same as that of FIG. 6A. To a gate of the HVP, voltage 0V is applied when the block is selected, and Vdd is applied when the block is not selected.

A high voltage of VRDEC is supplied to a drain of the HVND2. The drain of the HVP is connected to a gate and a selected block node BLKSEL_A of the HVND2. The source of the HVND1 is also simultaneously connected to the selected block node BLKSEL_A.

A block BLK0 connected to the selected block node BLKSEL_A is selected with a gate signal BSTON of the HVND1 and/or the LVND. When the high voltage of the VRDEC is supplied to the drain of the HVND2, a high voltage pulse is supplied to the selected block node BLKSEL_A through the HVND2 and the HVP, and gates of the transfer transistors TTr0 to TTr(i+5) in the transfer switch group 51A is driven at a high voltage.

In the selected block, a high program voltage VPGMH is applied to the gates of the transfer transistors TTr0 to TTr(i+5) in the transfer switch group 51A for selecting the word line WL by means of the following method. A level shifter operation (write-in operation of the selected block) will now be described with reference to FIG. 6B.

(A) Turn the HVND1 and the LVND ON to precharge the selected block node BLKSEL_A ($V_y$) to approximately 2V.
(B) Turn OFF the HVND1 and the LVND.
(C) Since the HVND2 is in the ON state, transfer VTD2 to the source ($V_x$) of the HVP among the voltages VRDEC to be supplied to the drain.
(D) Since the gate of the HVP is 0V and the source S/n type well NW are VTD2, turn the HVP ON and transfer the $V_x$ potential VTD2 to the drain side ($V_y$).
(E) Since the gate of the HVND2 is boosted to the voltage transferred from approximately 2V, transfer high potential to the source ($V_x$) of the HVP.
(F) Repeat the above-mentioned operation to boost the selected block node BLKSEL_A ($V_y$) to the program voltage VPGMH.

Figure 7A:
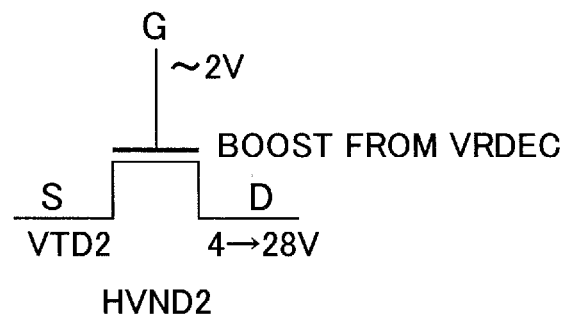
FIG. 7A illustrates an example of a voltage relationship of HVND2 to be applied to the level shifter.
Figure 7B:
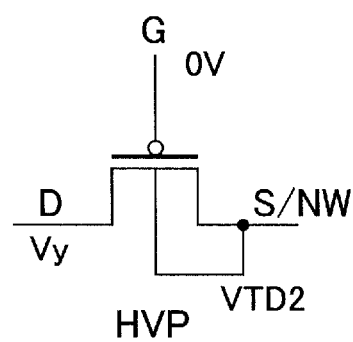
FIG. 7B illustrates an example of a voltage relationship of HVP to be applied to the level shifter.
Figure 7C:
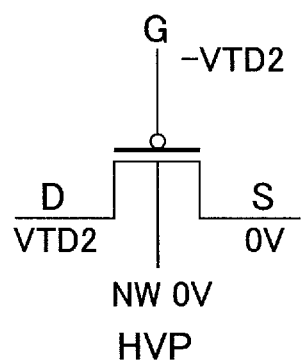
FIG. 7C illustrates an example of a voltage relationship equivalent to FIG. 7B.

FIG. 7A illustrates an example of a voltage relationship of the HVND2 to be applied to the level shifter 53A, FIG. 7B illustrates an example of a voltage relationship of the HVP to be applied to the level shifter 53A, and FIG. 7C illustrates an example of a voltage relationship equivalent to that of FIG. 7B.

More specifically, as illustrated in FIGS. 7B and 7C, it is only necessary that the HVP is turned ON in the case of the above-mentioned (D), and therefore the threshold voltage of the HVP>-VTD2 may be satisfied.

Figure 5B:
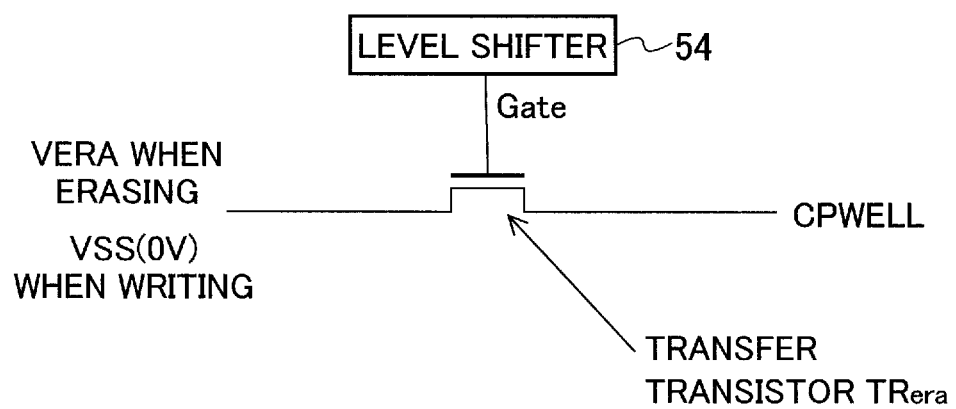
FIG. 5B is a diagram illustrating a circuit configuration example used for an erasing operation in the nonvolatile semiconductor memory device according to the embodiments.

Next, a circuit configuration used for an erasing operation of the nonvolatile semiconductor memory device according to the embodiments will now be schematically described with reference to FIG. 5B.

It is necessary to apply an erasing voltage VERA to a well line CPWELL connected to the p$^+$ type impurity diffusion region 40 at the time of the erasing operation. It is configured so that the erasing voltage VERA is applied to the well line CPWELL through a transfer transistor TRera. The gate voltage for turning ON the transfer transistor TRera is boosted by the level shifter 53A having a similar type of circuit of the level shifter 54. On the other hand, at the time of writing, a voltage in the vicinity of the VSS (0V) is applied to the well line CPWELL. Accordingly, at least a high voltage is not applied thereto.

Figure 8A:
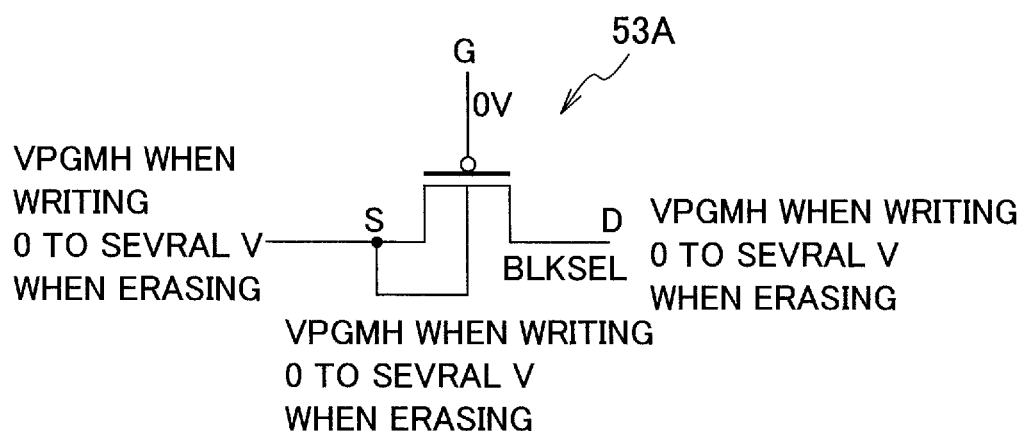
FIG. 8A illustrates an example of a voltage relationship applied when writing and erasing HVP of level shifter 53A, in the nonvolatile semiconductor memory device according to the embodiments.
Figure 8B:
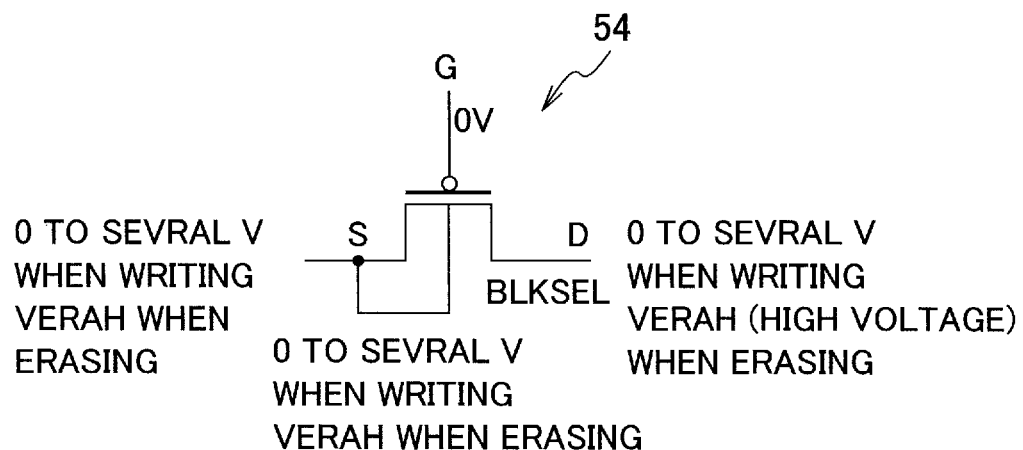
FIG. 8B illustrates an example of a voltage relationship applied when writing and erasing HVP of level shifter 54, in the nonvolatile semiconductor memory device according to the embodiments.

FIG. 8A illustrates an example of a voltage relationship to be applied when writing and erasing the HVP of the level shifter 53A, and FIG. 8B illustrates an example of a voltage relationship to be applied when writing and erasing the HVP of the level shifter 54.

At the time of the write-in operation of the selected block, as illustrated in FIG. 8A, when the gate voltage of the HVP in the level shifter 53A=0V, the voltage of the source S becomes a writing voltage VPGMH level, and the voltage of the drain D connected to the selected block node BLKSEL also becomes a writing voltage VPGMH level. The voltage of the n type well NW of the HVP also becomes the writing voltage VPGMH level. In this case, a value of the writing voltage VPGMH is approximately 30V.

At the time of the write-in operation of the selected block, as illustrated in FIG. 8B, when the gate voltage of the HVP in the level shifter 54=0V, the voltage of the source S is changed from 0 to several Volts (V), and the voltage of drain D connected to the gate of the transfer transistor TRera is also changed from 0 to several V level. The voltage of the n type well NW of the HVP is also changed from 0 to several V level. This is because no high voltage is applied to the CPWELL at the time of the program operation.

At the time of the erasing operation of the selected block, as illustrated in FIG. 8A, when the gate voltage=0V of the HVP in the level shifter 53A=0V, the voltage of the source S is changed approximately from 0V to several Volts (V), for example, and the voltage of the drain D connected to the selected block node BLKSEL is also changed approximately from 0 to several V level. The voltage of the n type well NW of the HVP is also changed approximately from 0 to several V level. This is because it is not necessary to apply a high voltage to the word line at the time of the erasing operation.

At the time of the erasing operation of the selected block, as illustrated in FIG. 8B, when the gate voltage of the HVP in the level shifter 54=0V, the voltage of the source S becomes VERAH, and the voltage of the drain D connected to the gate of the transfer transistor TRera also becomes VERAH. The voltage of the n type well NW of the HVP is also VERAH. At the time of the erasing operation, the erasing voltage VERA is applied to the well line CPWELL (i.e., source line) from the drain of the transfer transistor TRera. The erasing voltage VERAH is approximately 30V, for example.

(Substrate Structure)

Figure 9A:
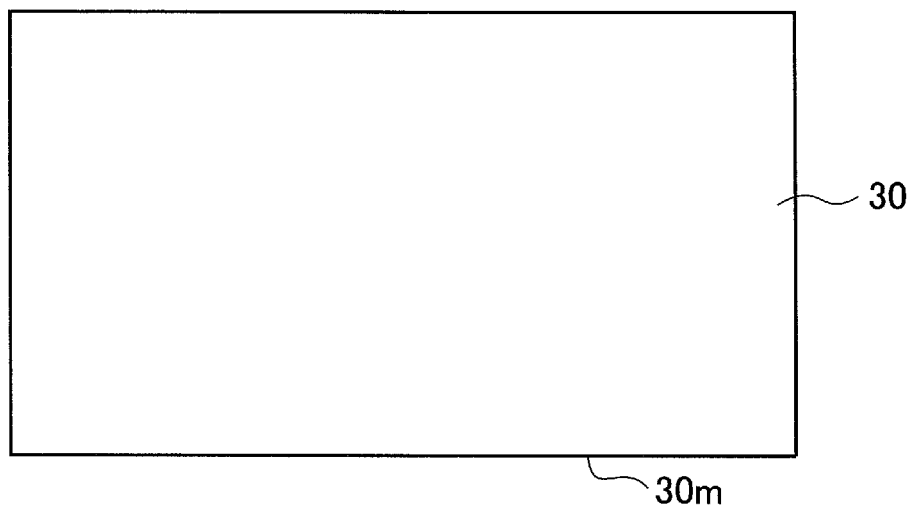
FIG. 9A is a schematic cross-sectional structure diagram of a semiconductor substrate including a mirror surface on a back side surface thereof, in a nonvolatile semiconductor memory device according to a comparative example.
Figure 9B:
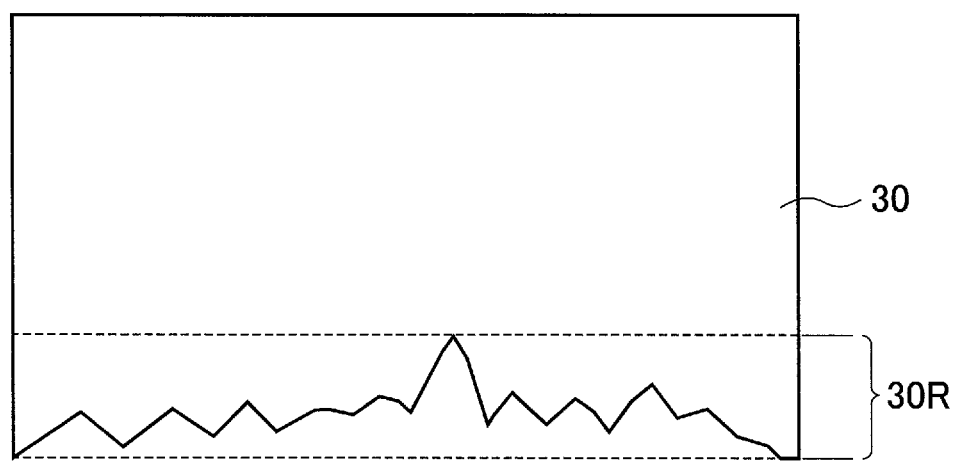
FIG. 9B is a schematic cross-sectional structure diagram of a semiconductor substrate including a crushed layer on a back side surface thereof, in the nonvolatile semiconductor memory device according to the embodiments.

FIG. 9A illustrates a schematic cross-sectional structure of a semiconductor substrate 30 including a mirror surface 30 m on a back side surface thereof, in a nonvolatile semiconductor memory device according to the comparative example, and FIG. 9B illustrates a schematic cross-sectional structure of a semiconductor substrate 30 including a crushed layer 30R on a back side surface thereof, in the nonvolatile semiconductor memory device according to the embodiments.

Figure 10A:
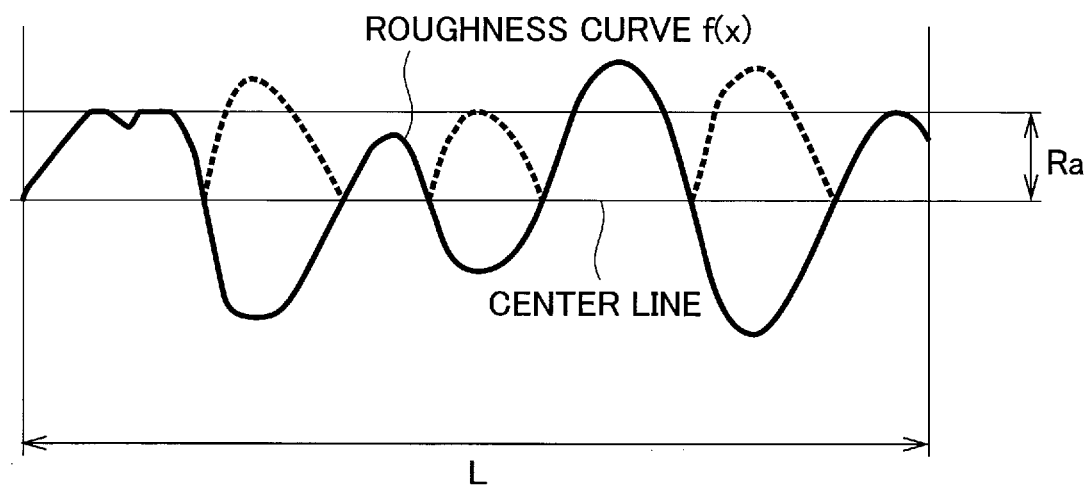
FIG. 10A is an explanatory diagram of center line average roughness $R_a$.
Figure 10B:
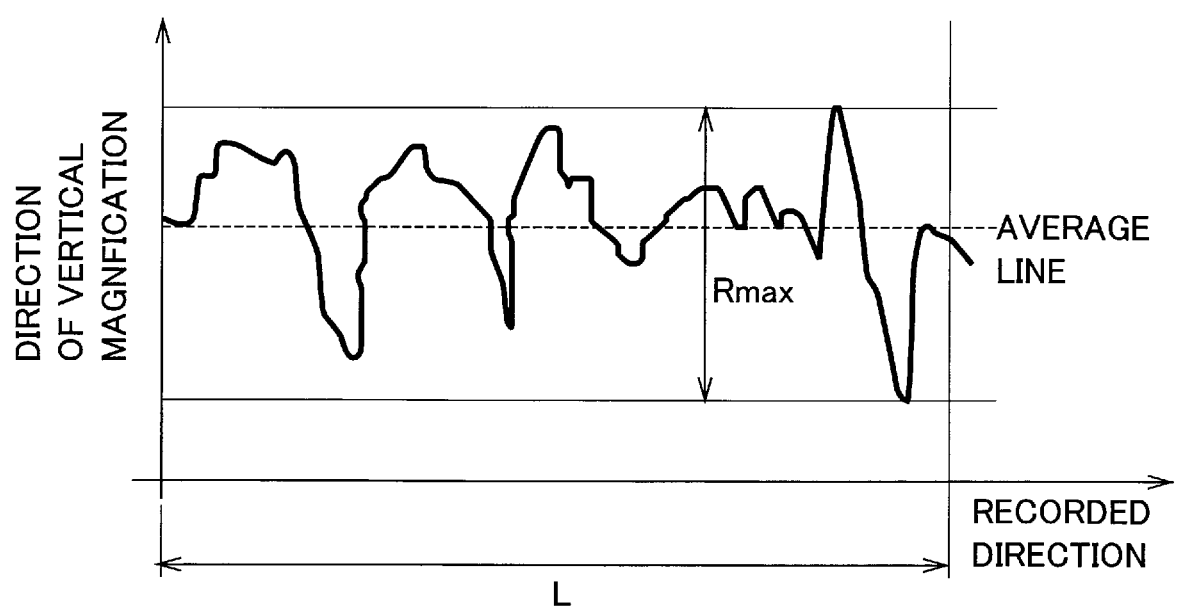
FIG. 10B is an explanatory diagram of the maximum height $R_{max}$.

Gettering Dry Polish (GDP) process can be applied as a process of forming the crushed layer 30R on the back side surface of the semiconductor substrate 30, for example. In the crushed layer 30R, center line average roughness $R_a$ is expressed as illustrated in FIG. 10A, and the maximum height Rmax is expressed as illustrated in FIG. 10B. As illustrated in FIG. 10A, the center line average roughness Ra is a value in terms of micrometers (μm) obtained by folding the roughness curve from the center line and dividing by length L the area obtained with the roughness curve and the center line. Moreover, the maximum height Rmax is a value in terms of micrometers (μm) by obtaining the maximum height of a portion where the cross-sectional curve is extracted with the reference length L.

In the nonvolatile semiconductor memory device according to the embodiments, a value of the maximum height Rmax of the crushed layer 30R is approximately several tens of nm, for example. A value of the center line average roughness Ra is approximately several nanometers (nm), for example.

In the nonvolatile semiconductor memory device according to the embodiments, the back side surface of the semiconductor substrate 30 is made into the crushed layer finish, and thereby heavy metal ions such as Cu ions entering from the back surface are gettered to prevent intrusion into the device. On the other hand, if the semiconductor substrate 30 is thin-layered until the crushed layer 30R on the back side surface can touch a depletion layer, a leak occurs in the crushed layer 30R on the back side surface.

(Comparative Examples)

Figure 11:
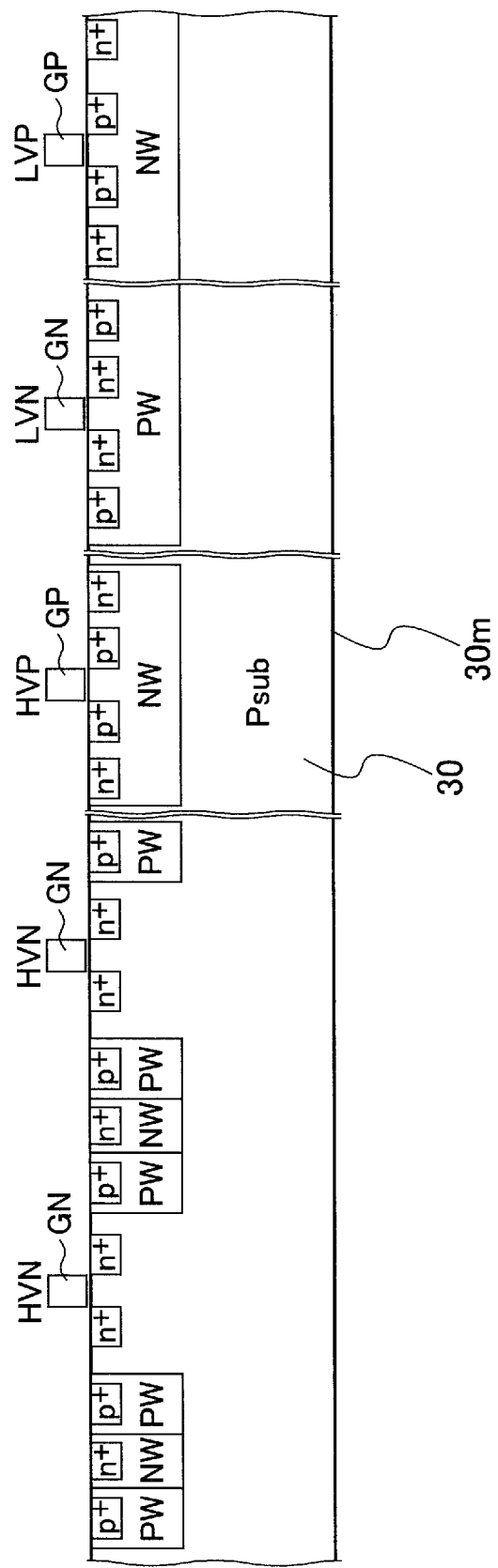
FIG. 11 is a schematic cross-sectional structure diagram of HVN, HVP, LVN, and LVP which composes a peripheral circuit, in the nonvolatile semiconductor memory device according to the comparative example.

FIG. 11 illustrates a schematic cross-sectional structure of a peripheral circuit constituted by an n channel high voltage MOS transistor HVN, a p channel high voltage MOS transistor HVP, an n channel low voltage MOS transistor LVN, and a p channel low voltage MOS transistor LVP, in the nonvolatile semiconductor memory device according to the comparative example.

In this case, the high voltage MOS transistor means a transistor capable of operating in a voltage range from approximately 15V to approximately 35V, for example. Moreover, the low voltage MOS transistor means a transistor capable of operating in a voltage range from approximately 0V to approximately several volts (V), for example. The program voltage VPGM, the erase voltage VERA, and the like which are specified with the operating voltage of NAND flash memories are within a voltage range from approximately 15V to approximately 35V, for example. For both the p channel and the n channel, a thickness of the gate oxide layer of the high voltage MOS transistor is approximately 40 nm, for example, and a thickness of the gate oxide layer of the low voltage MOS transistor is approximately 8 nm, for example.

Reference sign $P_{sub}$ denotes a p type semiconductor substrate 30. In the nonvolatile semiconductor memory device according to the comparative example, the back side surface of the semiconductor substrate 30 includes a mirror surface 30 m. Reference signs GPs respectively denote the gates of the HVP and the LVP. Reference sign GNs respectively denote the gates of the HVN and the LVN. Reference signs NW and PW respectively denote a n type well and a p type well.

In the HVP, n$^+$ regions formed in the NW are respectively contact regions of the NW, and p$^+$ regions respectively denote a source region and a drain region of the HVP. In the HVN, n$^+$ regions formed in the NW are respectively contact regions of the NW, and p$^+$ regions formed in the PW are respectively contact regions of the PW and the Psub. The n$^+$ regions formed on the surface respectively denote a source region and a drain region of the HVN.

In the LVP, n$^+$ regions formed in the NW are respectively contact regions of the NW, and p$^+$ regions respectively denote a source region and a drain region of the HLVP. In the LVN, p$^+$ regions formed in the PW are respectively contact regions of the PW, and n$^+$ regions formed in the PW respectively denote a source region and a drain region of the LVN. Moreover, in the HVP, the HVN, the LVP, and the LVN, the diffusion regions and the well regions are insulated and separated from each other by Shallow Trench Isolation (STI) or the like, but the illustration thereof is omitted.

Also in the following description of the nonvolatile semiconductor memory devices according to the following first to sixth embodiments, the same display is applied to a part which is common to the comparative example in the respective diffusion regions and the respective well regions, in the HVN, the HVP, the LVN, and the LVP, the detailed description thereof will be omitted but different components will be described.

(First Embodiment)

Figure 12:
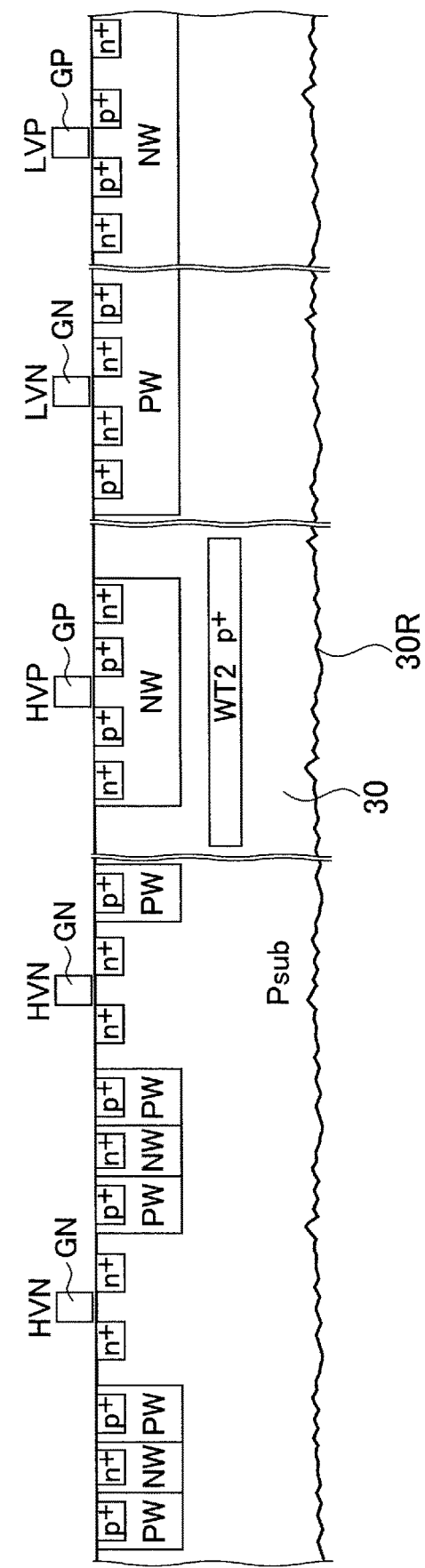
FIG. 12 is a schematic cross-sectional structure diagram of HVN, HVP, LVN, and LVP which composes a peripheral circuit, in the nonvolatile semiconductor memory device according to the first embodiment.

FIG. 12 illustrates a schematic cross-sectional structure of HVN, HVP, LVN, and LVP which constitute a peripheral circuit, in a nonvolatile semiconductor memory device 20 according to a first embodiment.

As illustrated in FIG. 12, the nonvolatile semiconductor memory device 20 according to the first embodiment includes: a p type semiconductor substrate 30 including a crushed layer 30R on a back side surface thereof; a memory cell array 21 (cf. FIG. 4) disposed on a front side surface of the semiconductor substrate 30 opposite to the crushed layer 30R; and a p channel high voltage MOS transistor HVP disposed on the semiconductor substrate 30, the p channel high voltage MOS transistor HVP including a p type channel, the p channel high voltage MOS transistor HVP configured to supply a high voltage to the memory cell array 21. In this case, the memory cell array 21 is disposed on the semiconductor substrate 30, as illustrated in FIG. 4.

The p channel high voltage MOS transistor HVP includes: an n type well region NW disposed on a front side surface opposite to the crushed layer 30R of the semiconductor substrate 30, the n-well region NW having a conductivity type which is an n type opposite to the p type; a p$^+$ source region and a p$^+$ drain region disposed in the n type well region NW; and a p type first high concentration layer WT2 disposed between the crushed layer 30R and the n type well region NW, the p type first high concentration layer WT2 having a higher concentration than an impurity concentration of the semiconductor substrate 30. The first high concentration layer WT2 is in an electrically floating state.

As is illustrated in FIG. 12, the nonvolatile semiconductor memory device 20 according to the first embodiment further includes: an n channel high voltage MOS transistor HVN disposed on the semiconductor substrate 30; an n channel low voltage MOS transistor LVN disposed on the semiconductor substrate 30; and a p channel low voltage MOS transistor LVP disposed on the semiconductor substrate 30.

Moreover, the nonvolatile semiconductor memory device 20 according to the first embodiment includes a selected block node BLKSEL, and level shifters 53A and 54 connected to the memory cell array 21 through the selected block node BLKSEL. The level shifters 53A and 54 includes the above-mentioned p channel high voltage MOS transistor HVP. The level shifter 53A is as described with reference to FIGS. 5A, 6A, 6B, and 8A. The level shifter 54 is as described with reference to FIGS. 5B and 8B.

As illustrated in FIG. 12, in the nonvolatile semiconductor memory device 20 according to the first embodiment, for example, impurity ions, such as boron, are ion-implanted into a relatively deep position in the semiconductor substrate 30 of the HVP which constitutes the level shifter of the three-dimensional (3D) NAND flash memory to form the high concentration layer WT2.

When the 3D NAND flash memory chip is mounted in a package, it is necessary to form the 3D NAND flash memory chip to have a thickness equal to or less than a specified thickness. The chip thickness corresponds to the total thickness of a thickness of a silicon substrate, a height of the NAND flash memory device, and a thickness of a passivation film, such as polyimide.

In order to form the thickness of 3D NAND flash memory chip to the specified thickness, the semiconductor substrate 30 is thin-layered to approximately several μm to approximately several tens of μm, for example. The thin-layered semiconductor substrate 30 is realized by grinding the back side surface of the semiconductor substrate 30, but when the thickness becomes equal to or less than a certain thickness, an operation failure occurs in the 3D NAND flash memory chip, and thereby further thin-layering is inhibited. The reason for the operation failure is considered that a depletion layer which spreads into the p type semiconductor substrate 30 from the n type well NW of the HVP which constitutes the level shifter 53 reaches at the bottom of the thin-layered semiconductor substrate 30, thereby causing a leak of the HVP.

Although the HVP of the level shifter unit is formed on the n type well NW, high voltages, such as the program voltage VPGMH and the erase voltage VERAH, are applied to the n type well NW, in the write-in operation and the erasing operation, as illustrated in the above-mentioned FIGS. 8A and 8B. At that time, the depletion layer is greatly extended in the p type semiconductor substrate 30. In order to suppress a degree of extensibility of the depletion layer, impurities (e.g., boron or the like) are ion-implanted into a relatively deep position in the p type semiconductor substrate 30 of the HVP in the level shifter unit, to form the high concentration layer WT2. Thereby, such a thin-layered semiconductor substrate 30 can be realized.

As described above, according to the first embodiment, since the degree of extensibility of the depletion layer which spreads in the semiconductor substrate under the n type well NW of the HVP constituting the level shifter can be suppressed, a leakage current of the semiconductor substrate can be suppressed and thereby the highly reliable nonvolatile semiconductor memory device can be provided.

(Simulation Results)

Figure 13A:
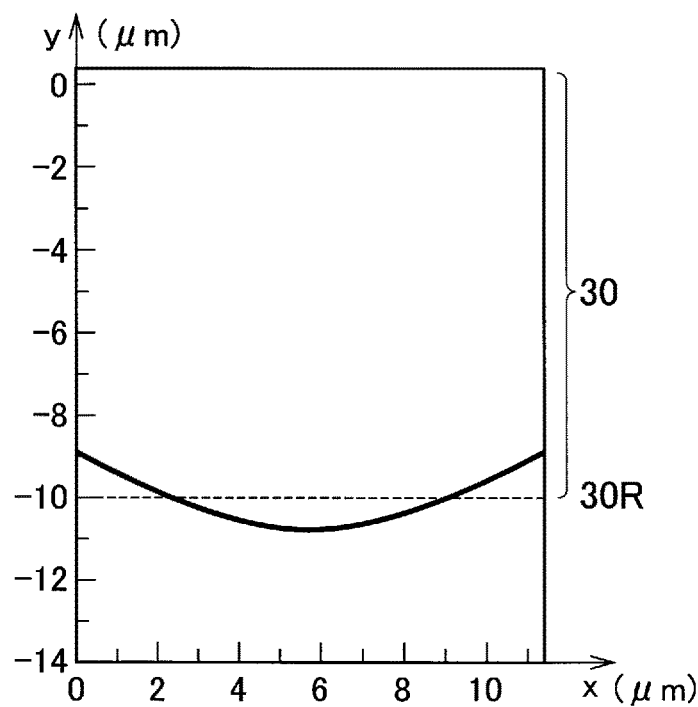
FIG. 13A is a schematic diagram illustrating a simulation result of a reaching distance of a depletion layer in an HVP region when not forming a high concentration layer WT2, as a comparative example.
Figure 13B:
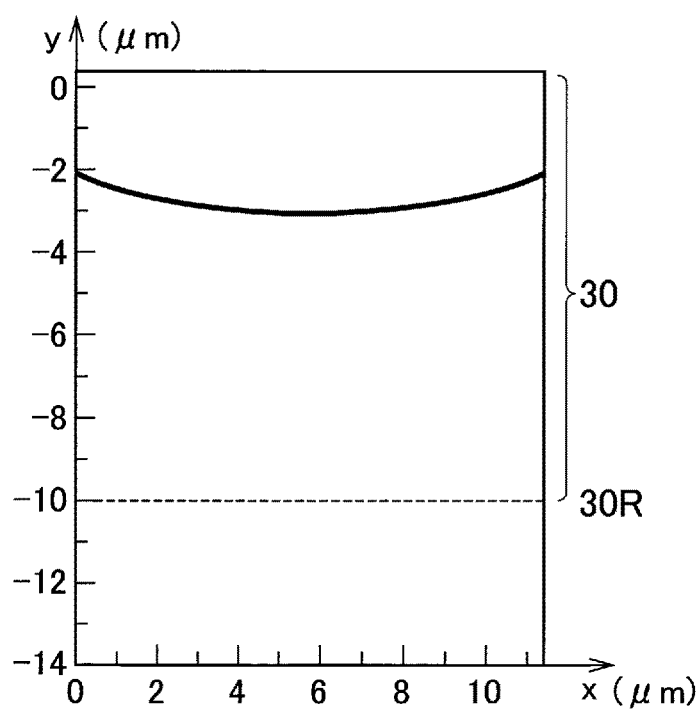
FIG. 13B is a schematic diagram illustrating a simulation result of a reaching distance of a depletion layer of an HVP region, in the nonvolatile semiconductor memory device according to the first embodiment.

As a comparative example, FIG. 13A schematically illustrates a simulation result of a reaching distance of the depletion layer in the HVP region when not forming the high concentration layer WT2. FIG. 13B schematically illustrates a simulation result of the reaching distance of the depletion layer in the HVP region, in the nonvolatile semiconductor memory device according to the first embodiment. In FIGS. 13A and 13B, the horizontal axis x (μm) expresses a size in a lateral direction of the HVP region centering on a position of approximately 6 μm, and the vertical axis y (μm) expresses a depth direction of the semiconductor substrate 30 with a negative numerical value. The vicinity of y=0 μm corresponds to the front side surface of the semiconductor substrate 30 and minus 10 μm is a position of the crushed layer 30R on the back side surface thereof. More specifically, there is illustrated a simulation result of the reaching distance of the depletion layer of the HVP region in the thin-layered semiconductor substrate 30 having the thickness of approximately 10 μm.

When not forming the high concentration layer WT2, the depletion layer illustrated with the solid line reaches the crushed layer 30R, as illustrated in FIG. 13A. On the other hand, in the nonvolatile semiconductor memory device according to the first embodiment, since the high concentration layer WT2 is provided at a position of approximately 2 μm, the depletion layer illustrated with the solid line does not reach the crushed layer 30R, as illustrated in FIG. 13B.

Figure 14A:
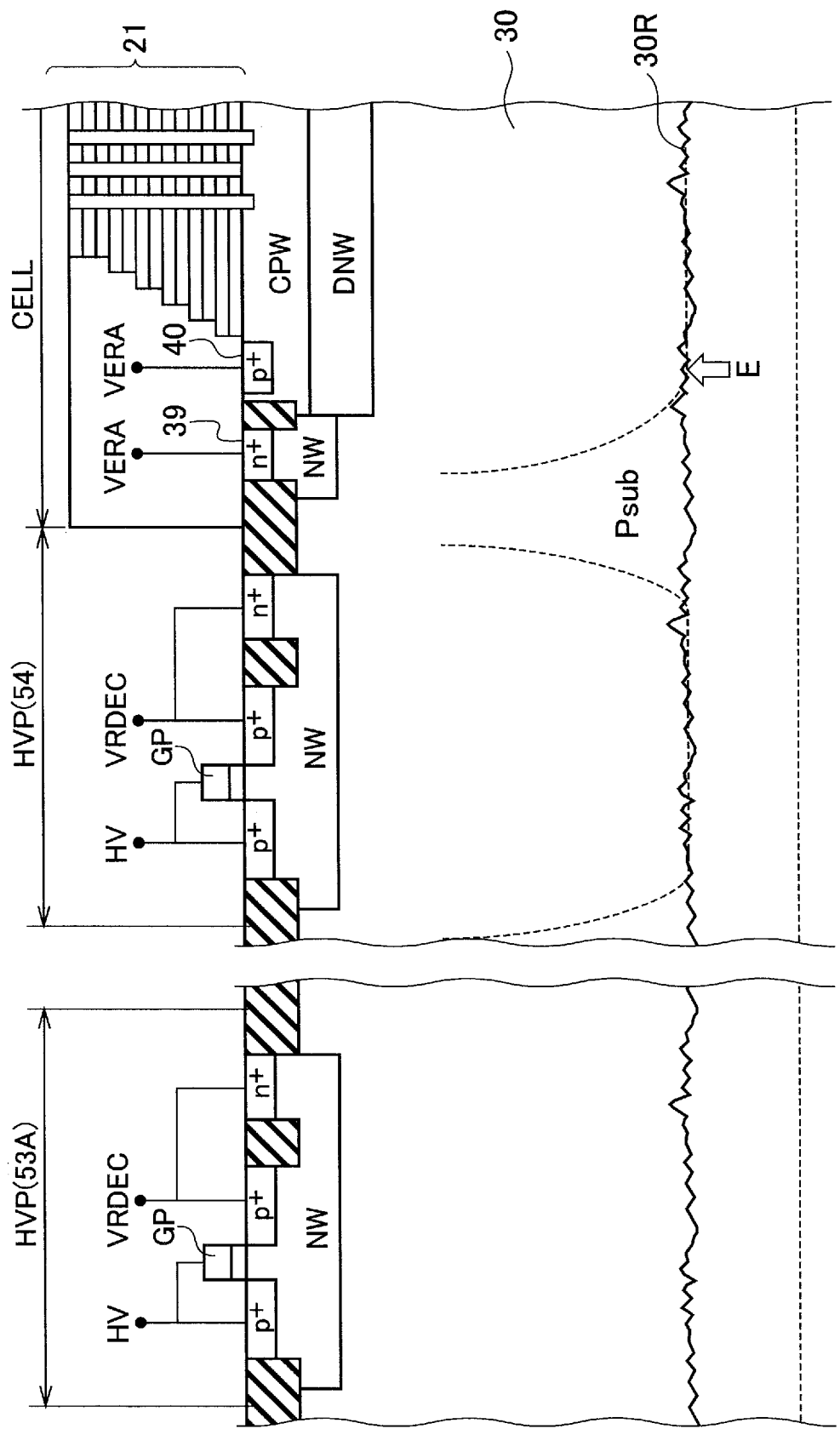
FIG. 14A is a schematic cross-sectional structure diagram for explaining an aspect that a depletion layer of an HVP region and a cell array region in the level shifter 54 spreads, at the time of erasing, when not forming the high concentration layer WT2, as a comparative example.
Figure 14B:
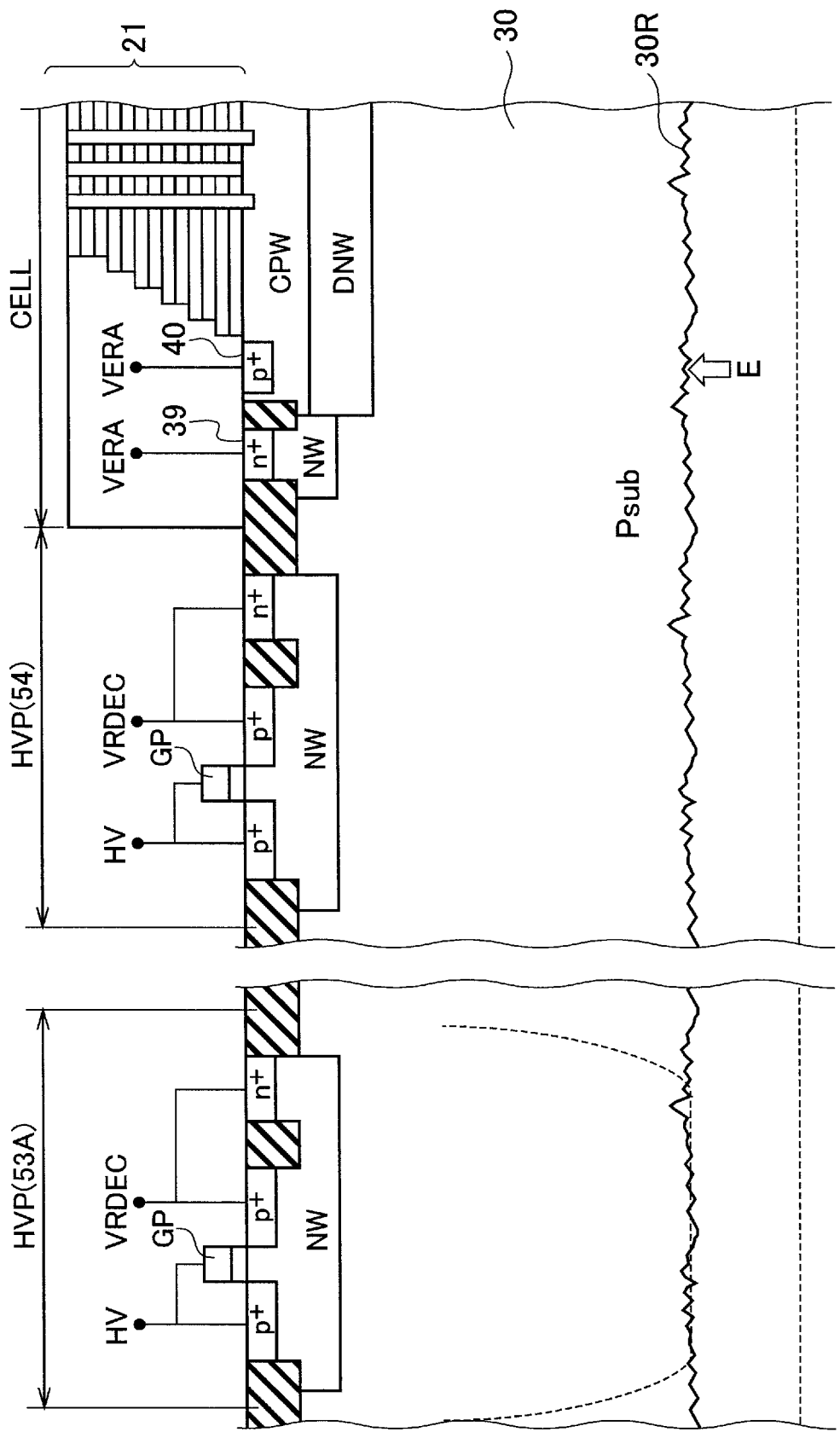
FIG. 14B is a schematic cross-sectional structure diagram for explaining an aspect that the depletion layer of the HVP region in the level shifter 53A spreads, at the time of writing, when not forming the high concentration layer WT2, as a comparative example.

FIG. 14A illustrates a schematic cross-sectional structure for explaining an aspect that depletion layers of the HVP (54) portion in the level shifter 54 and a cell array (CELL) portion respectively spread, at the time of erasing, when not forming the WT2, as a comparative example. The aspect that the depletion layers spread is illustrated with the dashed lines in the semiconductor substrate 30. Moreover, FIG. 14B illustrates a schematic cross-sectional structure for explaining an aspect that a depletion layer of the HVP (53A) portion in the level shifter 53A spreads, at the time of writing, when not forming the WT2, as a comparative example. Similarly, the aspect that the depletion layer spreads is illustrated with the dashed line in the semiconductor substrate 30. In the HVP region and the cell array region, the diffusion layers and the well regions are insulated and separated from each other by Shallow Trench Isolation (STI). In a final process of a wafer process, the semiconductor substrate 30 is thin-layered by the GDP process and the crushed layer 30R is formed on the back side surface thereof, as illustrated with the arrow E.

In FIGS. 14A and 14B, reference sign CPW denotes a p type well formed in the semiconductor substrate 30 under the memory cell array 21, and reference sign DNW denotes an n type well formed in a relatively deep position of the semiconductor substrate 30 under the CPW. The n type well DNW can supply a potential through the $n^+$ type impurity diffusion region 39 formed in the adjacent n type well NW. Moreover, a potential can be supplied also to the p type well CPW through the $p^+$ type impurity diffusion region 40. The $n^+$ type impurity diffusion region 39 and the $p^+$ type impurity diffusion region 40 respectively correspond to the regions illustrated with the same reference signs in FIG. 4.

Moreover, FIGS. 14A and 14B, the HVP includes: an n type well region NW, a $p^+$ source region and a $p^+$ drain region disposed in the n type well region NW, and an $n^+$ region (i.e., contact region for the NW) formed in the n type well region NW.

At the time of the erasing operation illustrated in FIG. 14A, the potential expressed with the VERA in the cell array region becomes an erasing voltage VERA. Moreover, the respective voltages illustrated in FIGS. 8A and 8B are applied to the respective units of the HVP of the level shifter 53A and the HVP of the level shifter 54. For this reason, at the time of the erasing operation, the depletion layers are extended to the same extent in both the cell array region and the HVP region of the level shifter 54, as illustrated with the dashed line in FIG. 14A. A thickness of the semiconductor substrate 30 is approximately 10 μm. Since the crushed layer 30R is formed on the back side surface of the semiconductor substrate 30, the depletion layer reaches the crushed layer 30R. On the other hand, the depletion layer does not extend in the HVP region of the level shifter 53A. This is because a voltage of approximately 0V to 0.5V may be applied to the word line.

At the time of the writing operation illustrated in FIG. 14B, the respective voltages illustrated in FIGS. 8A and 8B are applied to the respective units of the HVP of the level shifter 53A and the HVP of the level shifter 54. For this reason, at the time of the writing operation, the depletion layer extends in the HVP region of the level shifter 53A, as illustrated with the dashed line in FIG. 14B. A thickness of the semiconductor substrate 30 is approximately 10 μm. Since the crushed layer 30R is formed on the back side surface of the semiconductor substrate 30, the depletion layer reaches the crushed layer 30R. On the other hand, the depletion layers do not respectively extend in the HVP of the level shifter 54 and in the cell array region. This is because it is not necessary to apply a high voltage to the well line CPWELL in the cell array portion at the time of writing.

Figure 15:
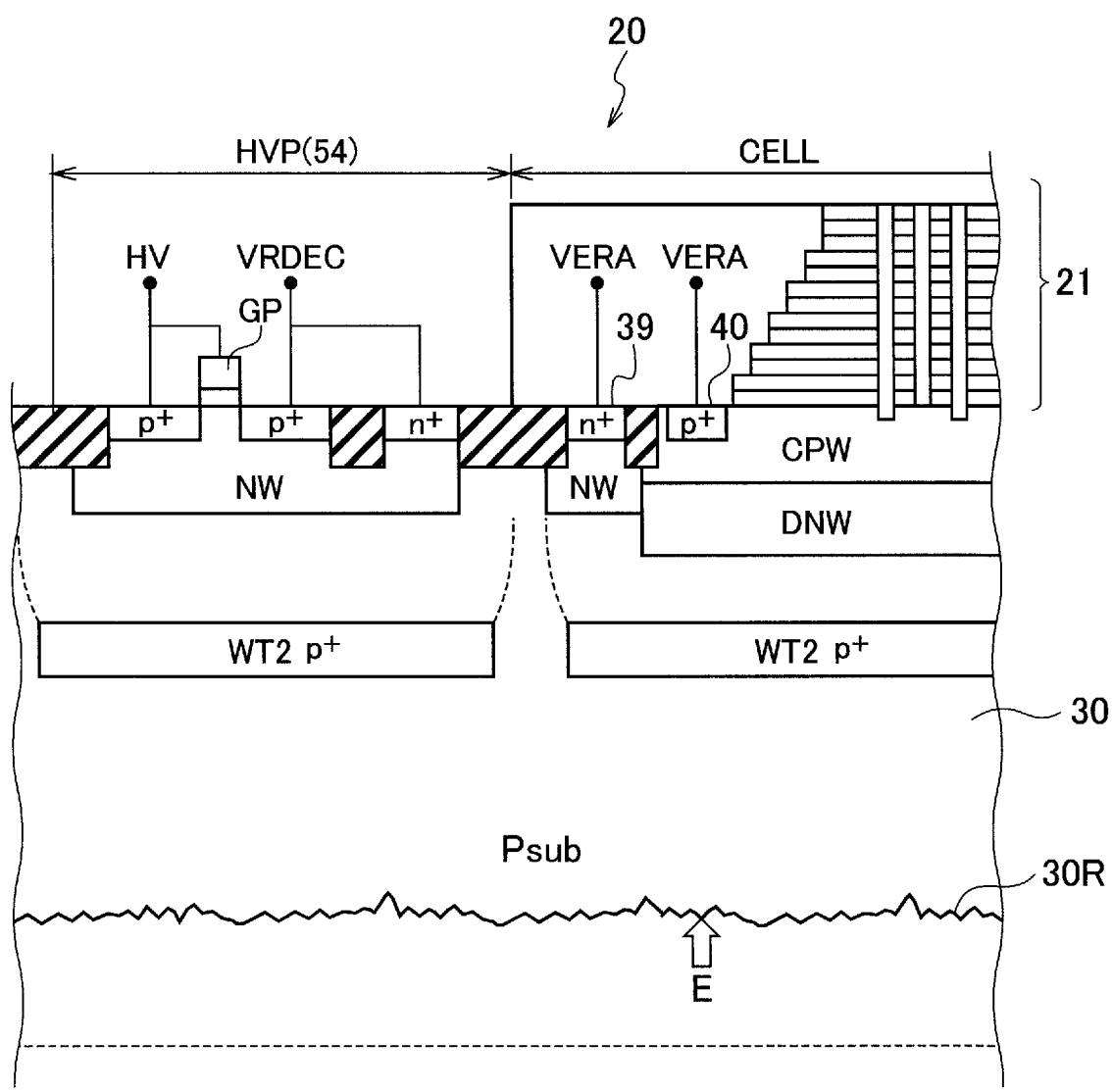
FIG. 15 is a schematic cross-sectional structure diagram for explaining an aspect that a depletion layer spreads, at the time of erasing, when forming the high concentration layer WT2 in the HVP region and the cell array region of the level shifter 54, in the nonvolatile semiconductor memory device according to the first embodiment.

On the other hand, FIG. 15 illustrates a schematic cross-sectional structure for explaining an aspect that a depletion layer spreads, at the time of erasing, when forming the high concentration layer WT2 in the HVP region and the cell array region of the level shifter 54, in the nonvolatile semiconductor memory device 20 according to the first embodiment. Although only the HVP in the level shifter 54 is illustrated in FIG. 15, the following description can similarly be applied to also the HVP in the level shifter 53A.

As illustrated in FIG. 15, the nonvolatile semiconductor memory device 20 according to the first embodiment includes: a p type semiconductor substrate 30 including a crushed layer 30R on a back side surface thereof; a memory cell array 21 disposed on a front side surface of the semiconductor substrate 30; and a p channel high voltage MOS transistor HVP disposed on the semiconductor substrate 30, the p channel high voltage MOS transistor HVP including a p type channel, the p channel high voltage MOS transistor HVP configured to supply a high voltage to the memory cell array 21. The p channel high voltage MOS transistor HVP includes: an n type well region NW disposed on a front side surface of the semiconductor substrate 30, the n-well region NW has a conductivity type which is an n type opposite to the p type; a p⁺ source region and a p⁺ drain region disposed in the n type well region NW; and a p type first high concentration layer WT2 disposed between the crushed layer 30R of the semiconductor substrate 30 and the n type well region NW (and DNW), the p type first high concentration layer WT2 having a higher concentration than an impurity concentration of the semiconductor substrate 30.

In the nonvolatile semiconductor memory device 20 according to the first embodiment, since the high concentration layer WT2 is provided, the depletion layer illustrated with the dashed line does not reach the crushed layer 30R, as illustrated in FIG. 15.

According to the first embodiment, since the high concentration layer WT2 is formed in the HVP region in the level shifter 54 and the cell array region, and the degree of extensibility of the depletion layer which spreads in the semiconductor substrate under the n type well NW of the HVP can be suppressed, a leakage current of the semiconductor substrate can be suppressed and thereby the highly reliable nonvolatile semiconductor memory device can be provided.

In the nonvolatile semiconductor memory device 20 according to the first embodiment, since the high concentration layer WT2 is provided, the depletion layer illustrated with the dashed line does not reach the crushed layer 30R, as illustrated in FIG. 15.

(Example of Impurity Concentration Profile)

Figure 16:
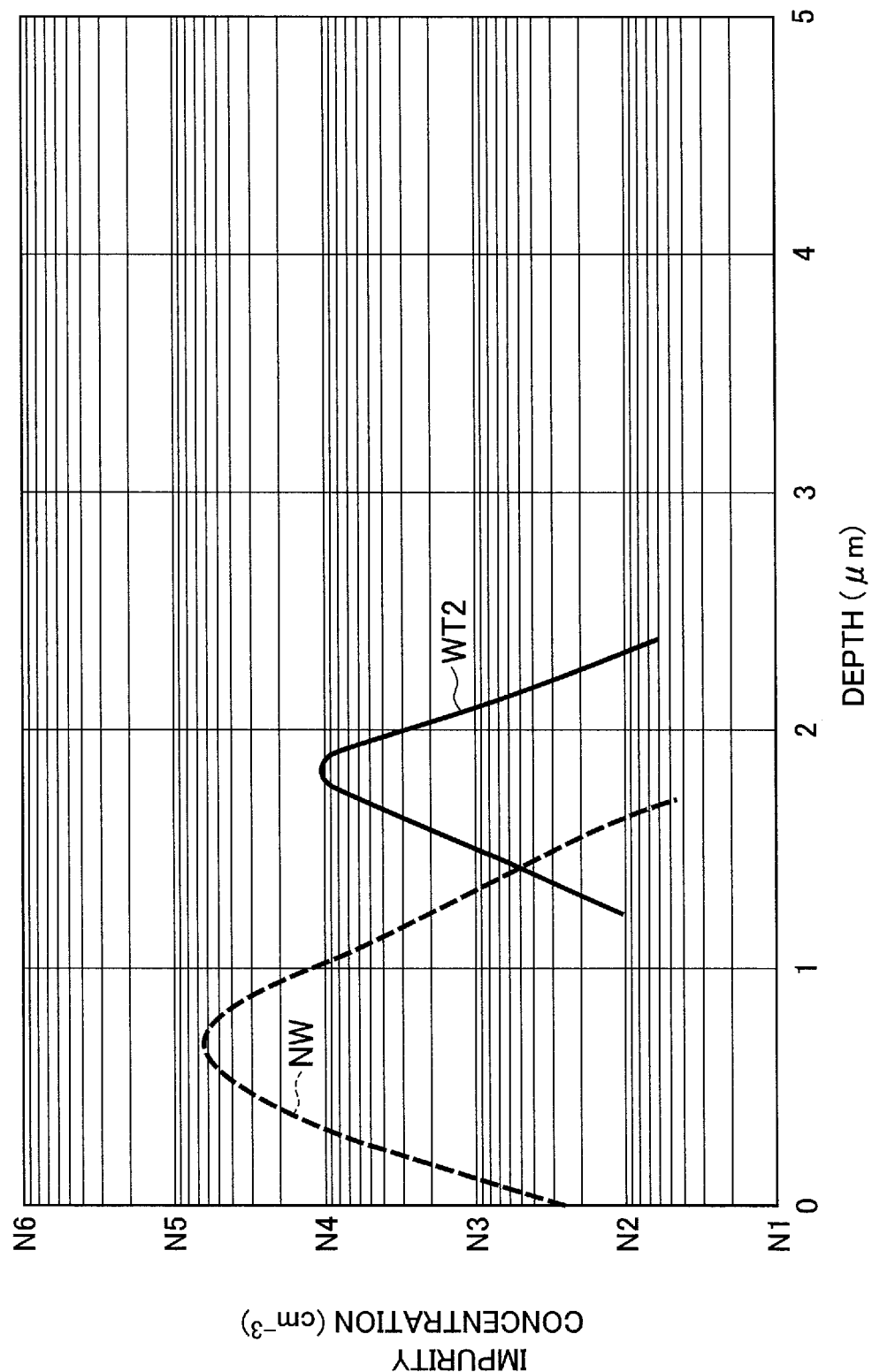
FIG. 16 illustrates an example of an impurity concentration profile of an n type well NW and a high concentration layer WT2 when forming the high concentration layer WT2 in the HVP region, in the nonvolatile semiconductor memory device according to the first embodiment.

FIG. 16 illustrates an example of an impurity concentration profile of an n type well NW and a high concentration layer WT2 when forming the high concentration layer WT2 in the HVP region, in the nonvolatile semiconductor memory device 20 according to the first embodiment. As illustrated in FIG. 16, a peak level of the n type impurity concentration in the n type well NW is higher than a peak level of the p type impurity concentration of the high concentration layer WT2. Moreover, a position of the peak level of the n type impurity concentration in the n type well NW is within a range from approximately 0.5 µm to approximately 1 µm, for example, and a position of the peak level of the p type impurity concentration of the high concentration layer WT2 is within a range from approximately 1.5 µm to approximately 2 µm, for example.

(Second Embodiment)

Figure 17:
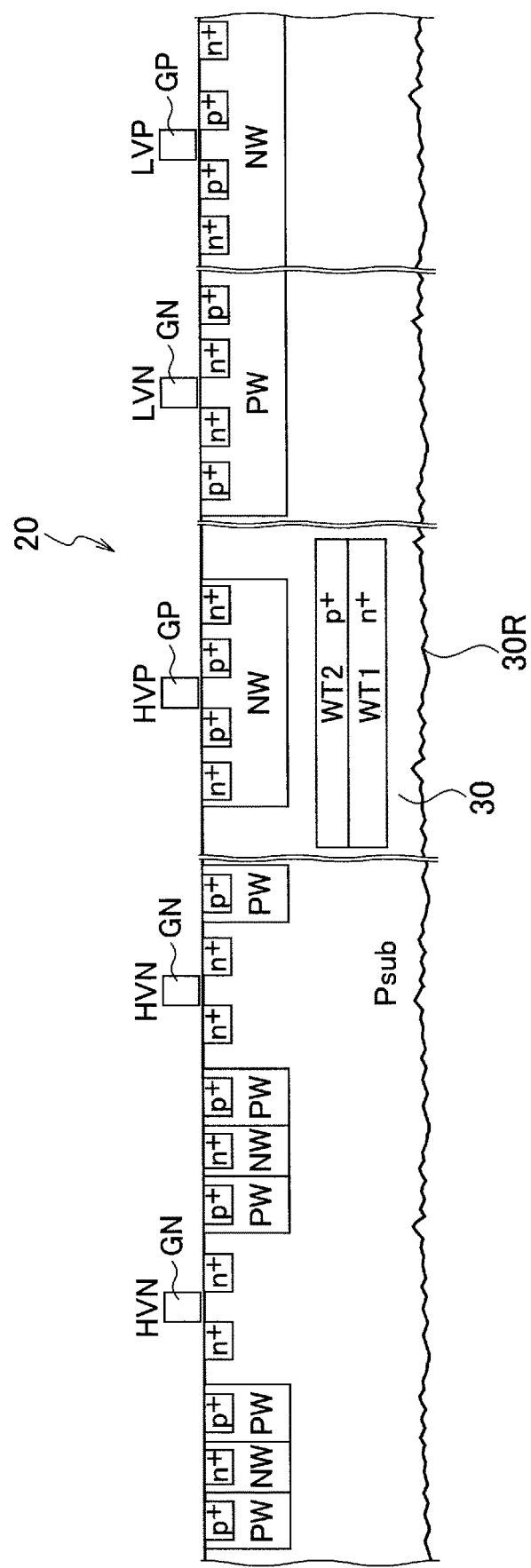
FIG. 17 is a schematic cross-sectional structure diagram of HVN, HVP, LVN, and LVP which composes a peripheral circuit, in a nonvolatile semiconductor memory device according to a second embodiment.

FIG. 17 illustrates a schematic cross-sectional structure of HVN, HVP, LVN, and LVP which constitute a peripheral circuit, in a nonvolatile semiconductor memory device 20 according to a second embodiment.

As illustrated in FIG. 17, the nonvolatile semiconductor memory device 20 according to the second embodiment includes an n type second high concentration layer WT1 disposed between the crushed layer 30R on the back side surface of the semiconductor substrate 30 and the first high concentration layer WT2. The second high concentration layer WT1 is in an electrically floating state. Other configurations are the same as those of the first embodiment.

According to the second embodiment, since the degree of extensibility of the depletion layer which spreads in the semiconductor substrate under the n type well NW of the HVP constituting the level shifter 54 can be suppressed, a leakage current of the semiconductor substrate can be suppressed and thereby the highly reliable nonvolatile semiconductor memory device can be provided.

Figure 18:
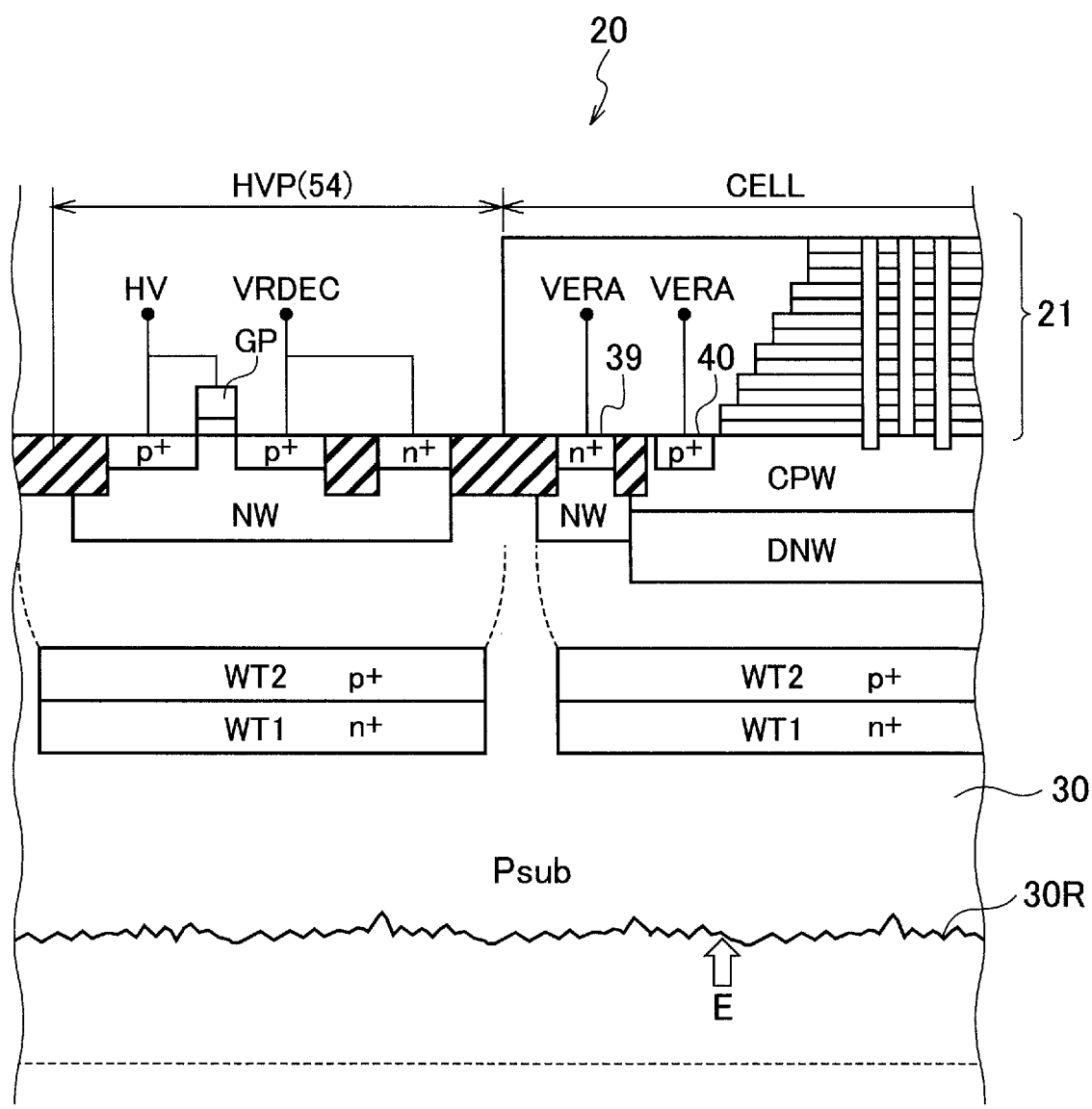
FIG. 18 is a schematic cross-sectional structure diagram for explaining an aspect that a depletion layer spreads, at the time of erasing, when forming a first high concentration layer WT2 and a second high concentration layer WT1 in the HVP region and the cell array region of the level shifter 54, in the nonvolatile semiconductor memory device according to the second embodiment.

FIG. 18 is a schematic cross-sectional structure for explaining an aspect that a depletion layer at the time of erasing spreads when forming a first high concentration layer WT2 and a second high concentration layer WT1 in the HVP region and the cell array region of the level shifter 54, in the nonvolatile semiconductor memory device 20 according to the second embodiment.

Also in the nonvolatile semiconductor memory device 20 according to the second embodiment, since the high concentration layer WT2 is provided, the depletion layer illustrated with the dashed line does not reach the crushed layer 30R, as illustrated in FIG. 18.

(Third Embodiment)

Figure 19:
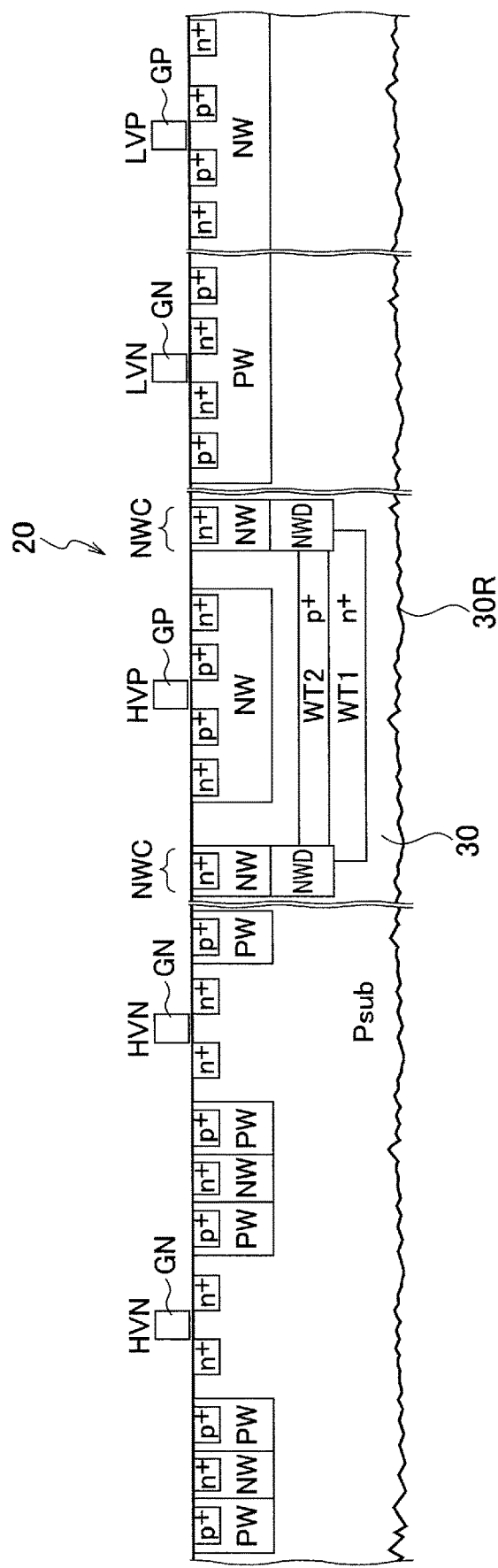
FIG. 19 is a schematic cross-sectional structure diagram of HVN, HVP, LVN, and LVP which composes a peripheral circuit, in a nonvolatile semiconductor memory device according to a third embodiment.

FIG. 19 illustrates a schematic cross-sectional structure of HVN, HVP, LVN, and LVP which constitute a peripheral circuit, in a nonvolatile semiconductor memory device 20 according to a third embodiment.

Figure 20A:
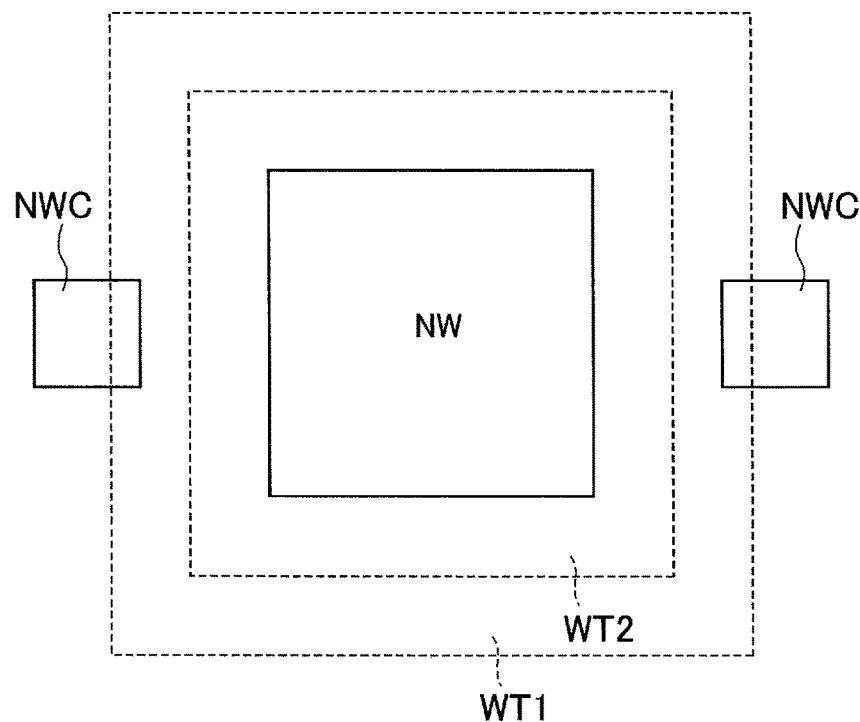
FIG. 20A illustrates an example of a schematic planar pattern configuration of HVP, in a nonvolatile semiconductor memory device according to a third embodiment.
Figure 20B:
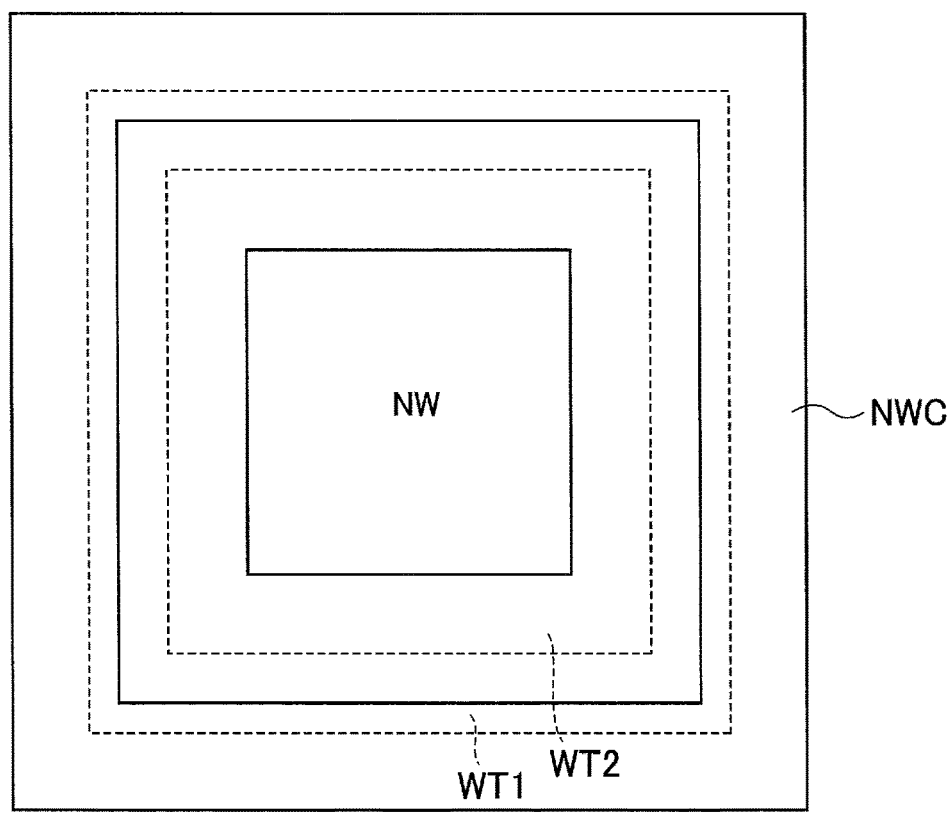
FIG. 20B illustrates another example of a schematic planar pattern configuration of HVP, in the nonvolatile semiconductor memory device according to the third embodiment.

Moreover, FIG. 20A illustrates an example of a schematic planar pattern configuration of HVP which constitutes the level shifter 54, in the nonvolatile semiconductor memory device 20 according to the third embodiment, and FIG. 20B illustrates another example of a schematic planar pattern configuration of HVP which constitutes the level shifter 54. A third high concentration contact layer NWC is disposed in the vicinity the n type well region NW in a planar view in FIG. 20A, but the third high concentration contact layer NWC is disposed around the n type well region NW in a planar view in FIG. 20B.

As illustrated in FIG. 20A, the nonvolatile semiconductor memory device 20 according to the third embodiment further includes the n type third high concentration contact layer NWC disposed in the vicinity of the n type well region NW on the semiconductor substrate 30, the third high concentration contact layer NWC electrically connected to the second high concentration layer WT1.

As illustrated in FIG. 20B, the nonvolatile semiconductor memory device 20 according to the third embodiment may further includes the n type third high concentration contact layer NWC disposed around the n type well region NW on semiconductor substrate 30 so as to surround the n type well region NW, the third high concentration contact layer NWC electrically connected to the second high concentration layer WT1.

In this case, the third high concentration contact layer NWC is composed by including an n type well NWD formed in a deeper position level, an n type well NW, and an n⁺ diffusion region formed in the n type well NW. By supplying a certain potential or zero potential to the third high concentration contact layer NWC, the potential of the second high concentration layer WT1 can be clamped. Other configurations are the same as those of the second embodiment.

According to the third embodiment, since the degree of extensibility of the depletion layer which spreads in the semiconductor substrate under the n type well NW of the HVP constituting the level shifter 54 can be suppressed, a leakage current of the semiconductor substrate can be suppressed and thereby the highly reliable nonvolatile semiconductor memory device can be provided.

(Fourth Embodiment)

Figure 21:
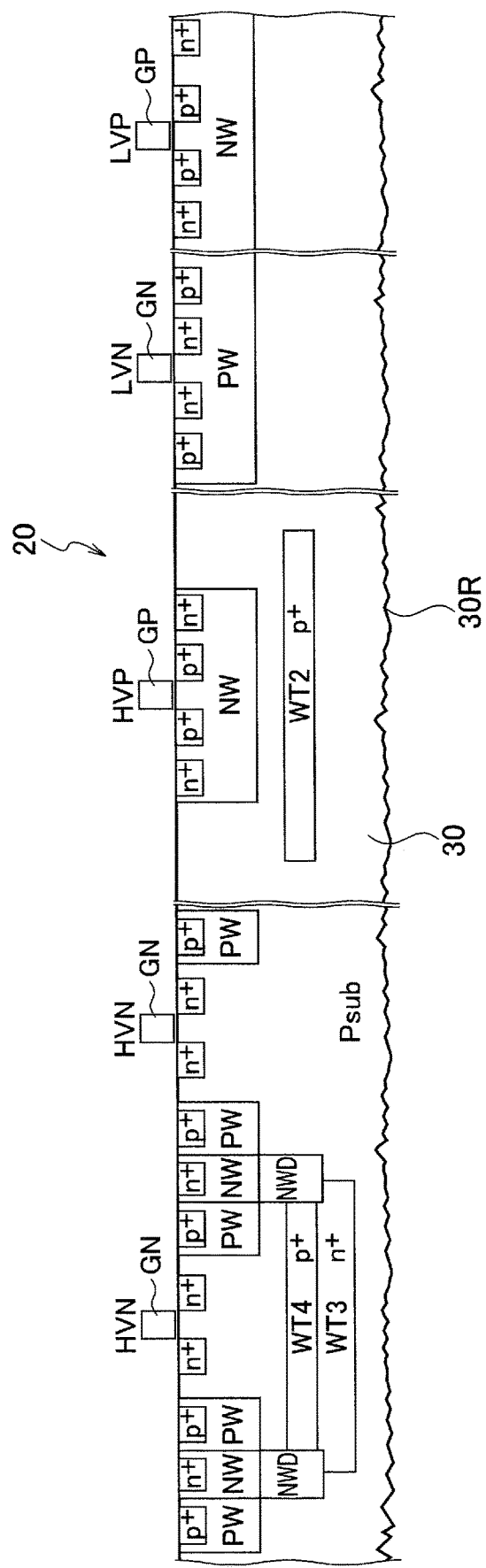
FIG. 21 is a schematic cross-sectional structure diagram of HVN, HVP, LVN, and LVP which composes a peripheral circuit, in a nonvolatile semiconductor memory device according to a fourth embodiment.

FIG. 21 illustrates a schematic cross-sectional structure of HVN, HVP, LVN, and LVP which constitute a peripheral circuit, in a nonvolatile semiconductor memory device 20 according to a fourth embodiment.

The HVP in the nonvolatile semiconductor memory device according to the fourth embodiment includes a configuration similar to that of the first embodiment (cf. FIG. 12).

As illustrated in FIG. 21, the nonvolatile semiconductor memory device 20 according to the fourth embodiment further includes a second conductivity-type high voltage MOS transistor HVN disposed on the semiconductor substrate 30, the high voltage MOS transistor HVN having an n type channel. The second conductivity-type high voltage MOS transistor HVN includes: an $n^+$ source region and an $n^+$ type drain region disposed on a front side surface of semiconductor substrate 30 opposite to the crushed layer 30R formed on the back side surface of the semiconductor substrate 30; a p type third high concentration layer WT2 disposed between the crushed layer 30R on the back side surface and the $n^+$ source region and $n^+$ type drain region, the p type third high concentration layer WT2 having a higher concentration than an impurity concentration of the semiconductor substrate 30; and an n type fourth high concentration layer WT3 disposed between the crushed layer 30R on the back side surface and the third high concentration layer WT4.

In this case, the n type fourth high concentration layer WT3 of the HVN portion supplies a certain potential or 0 potential to the high concentration contact layer, which is composed by including an n type well NWD formed in a deeper position level, an n type well NW, and an $n^+$ diffusion region formed in the n type well NW, and thereby the potential of the n type fourth high concentration layer WT3 can be clamped. Other configurations are the same as those of the first embodiment.

Moreover, as illustrated in FIG. 21, the nonvolatile semiconductor memory device according to the fourth embodiment includes a p type well PW formed to be adjacent to the n type well NW of the HVN portion, and a $p^+$ diffusion region formed in the p type well PW. In this case, although illustration is omitted, the p type well PW is formed with a double layered structure including a p type well PWT formed in a shallower position and a p type well PWD formed in a deeper position. Consequently, the HVN has a triple well structure including the p type well PWT formed in the shallower position, the p type well PWD formed in the deeper position, and the n type well NWD formed in the deeper position level, in the nonvolatile semiconductor memory device according to the fourth embodiment. The HVN including such a triple well structure is applied to the HVND1 which constitutes the level shifter 53A (refer to FIGS. 6A and 6B), the transfer transistors TTr0 to TTr(i+5) which constitute the transfer switch group 51 (refer to FIGS. 5A and 5B), and the like, for example.

According to fourth embodiment, the first high concentration layer WT2 under the n type well NW of the HVP which constitutes the level shifter, and the third high concentration layer WT4 of the HVN can be simultaneously formed. That is, the first high concentration layer WT2 under the n type well NW of the HVP can be formed without increasing the number of processes.

According to the fourth embodiment, since the degree of extensibility of the depletion layer which spreads in the semiconductor substrate under the n type well NW of the HVP constituting the level shifter 54 can be suppressed, a leakage current of the semiconductor substrate can be suppressed and thereby the highly reliable nonvolatile semiconductor memory device can be provided.

(Fifth Embodiment)

Figure 22:
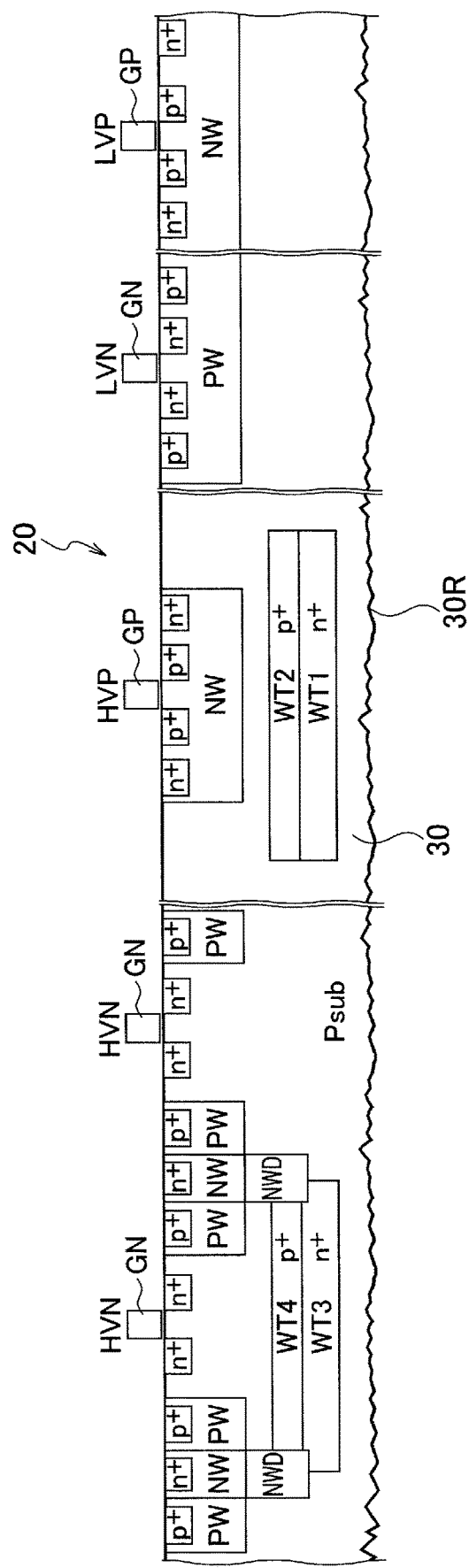
FIG. 22 is a schematic cross-sectional structure diagram of HVN, HVP, LVN, and LVP which composes a peripheral circuit, in a nonvolatile semiconductor memory device according to a fifth embodiment.

FIG. 22 illustrates a schematic cross-sectional structure of HVN, HVP, LVN, and LVP which constitute a peripheral circuit, in a nonvolatile semiconductor memory device 20 according to a fifth embodiment.

The HVP which constitutes the level shifter 54 includes a configuration similar to that of the second embodiment (FIG. 17), in the nonvolatile semiconductor memory device 20 according to the fifth embodiment. Moreover, the HVN includes a configuration similar to that of the fourth embodiment (cf. FIG. 21). Other configurations are the same as those of the second embodiment.

According to fifth embodiment, the first high concentration layer WT2 under the n type well NW of the HVP which constitutes the level shifter 54, and the third high concentration layer WT4 of the HVN can be simultaneously formed. Moreover, the second high concentration layer WT1 under the n type well NW of the HVP and the fourth high concentration layer WT3 of the HVN can be simultaneously formed. That is, the first high concentration layer WT2 and the second high concentration layer WT1 under the n type well NW of the HVP can be formed without increasing the number of processes.

According to the fifth embodiment, since the degree of extensibility of the depletion layer which spreads in the semiconductor substrate under the n type well NW of the HVP constituting the level shifter 54 can be suppressed, a leakage current of the semiconductor substrate can be suppressed and thereby the highly reliable nonvolatile semiconductor memory device can be provided.

(Sixth Embodiment)

Figure 23:
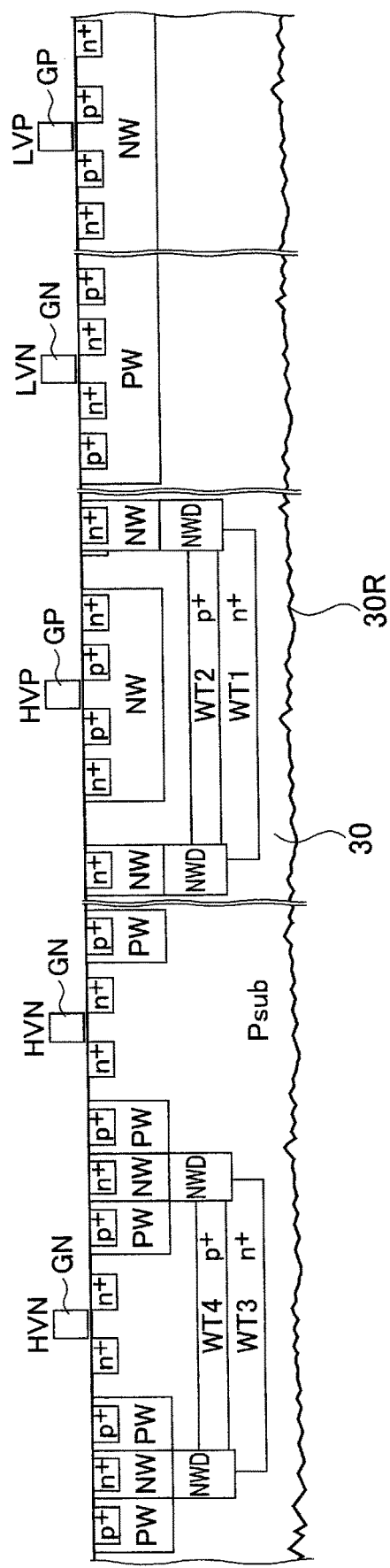
FIG. 23 is a schematic cross-sectional structure diagram of HVN, HVP, LVN, and LVP which composes a peripheral circuit, in a nonvolatile semiconductor memory device according to a sixth embodiment.

FIG. 23 illustrates a schematic cross-sectional structure of HVN, HVP, LVN, and LVP which constitute a peripheral circuit, in a nonvolatile semiconductor memory device 20 according to a sixth embodiment.

The HVP which constitutes the level shifter 54 includes a configuration similar to that of the third embodiment (cf. FIG. 19), in the nonvolatile semiconductor memory device 20 according to the sixth embodiment. Moreover, the HVN includes a configuration similar to that of the fourth embodiment (cf. FIG. 21). Other configurations are the same as those of the third embodiment.

According to sixth embodiment, the first high concentration layer WT2 under the n type well NW of the HVP which constitutes the level shifter 54, and the third high concentration layer WT4 of the HVN can be simultaneously formed. Moreover, the second high concentration layer WT1 under the n type well NW of the HVP and the fourth high concentration layer WT3 of the HVN can be simultaneously formed. That is, the first high concentration layer WT2 and the second high concentration layer WT1 under the n type well NW of the HVP can be formed without increasing the number of processes.

According to the sixth embodiment, since the degree of extensibility of the depletion layer which spreads in the semiconductor substrate under the n type well NW of the HVP constituting the level shifter 54 can be suppressed, a leakage current of the semiconductor substrate can be suppressed and thereby the highly reliable nonvolatile semiconductor memory device can be provided.

In the description of the above-mentioned embodiments, the first conductivity type and the second conductivity type may be reversed to form the respective unit. In that case, the conductivity types of the semiconductor substrate and the respective diffusion layers and well structures may also be reversed.

As described above, according to the embodiments, since the degree of extensibility of the depletion layer which spreads in the thin-layered semiconductor substrate having the crushed layer on the back side surface thereof under the n type well NW of the p channel high voltage MOS transistor HVP constituting the level shifter can be suppressed, a leakage current of the semiconductor substrate can be suppressed and thereby the highly reliable nonvolatile semiconductor memory device can be provided.

Although the embodiments have been described with the examples of the nonvolatile semiconductor memory devices, the embodiments are not limited to the nonvolatile semiconductor memory devices described herein. Any semiconductor device in addition to the nonvolatile semiconductor memory devices described herein can be similarly applied to the embodiments.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first conductivity-type semiconductor substrate comprising a crushed layer on a back side surface thereof;
   a memory cell array disposed on a front side surface of the semiconductor substrate opposite to the crushed layer; and
   a first conductivity-type high voltage transistor disposed on the semiconductor substrate, the first conductivity-type high voltage transistor including a first conductivity-type channel, the first conductivity-type high voltage transistor configured to supply a high voltage to the memory cell array, wherein the first conductivity-type high voltage transistor comprises:
   a well region disposed on the front side surface, the well region having a conductivity type which is a second conductivity type opposite to the first conductivity type;
   a first conductivity-type source region and a first conductivity-type drain region disposed in the well region;
   a first conductivity-type first high concentration layer disposed between the crushed layer and the well region, the first high concentration layer having a higher concentration than an impurity concentration of the semiconductor substrate;
   a selected block node; and
   a level shifter configured to supply a high voltage to the memory cell array through the selected block node, wherein the level shifter comprises,
   the first conductivity-type high voltage transistor,
   a second conductivity-type second high voltage transistor comprising a source connected to a source of the first conductivity-type high voltage transistor and the well region, a drain to which a high voltage is supplied, and a gate connected to a drain of the first conductivity-type high voltage transistor and the selected block node, and
   a second conductivity-type first high voltage transistor comprising a source connected to the drain of the first conductivity-type high voltage transistor and the selected block node, and a drain connected an outside, the second conductivity-type first high voltage transistor configured to drive the second conductivity-type second high voltage transistor.

2. The semiconductor device according to claim 1, wherein
   the first high concentration layer is in an electrically floating state.

3. The semiconductor device according to claim 1, wherein
   a peak level of a second conductivity type impurity concentration in the well region is higher than a peak level of a first conductivity type impurity concentration of the first high concentration layer.

4. The semiconductor device according to claim 1, further comprising
   a second conductivity-type second high concentration layer disposed between the crushed layer and the first high concentration layer.

5. The semiconductor device according to claim 4, wherein
   the second high concentration layer is in an electrically floating state.

6. The semiconductor device according to claim 4, further comprising
   a second conductivity-type high concentration contact layer disposed in a vicinity of the well region on the semiconductor substrate, the high concentration contact layer electrically connected to the second high concentration layer.

7. The semiconductor device according to claim 6, wherein
   the high concentration contact layer is disposed so as to surround the well region.

8. The semiconductor device according to claim 1, further comprising
   a second conductivity-type high voltage transistor disposed on the semiconductor substrate, the second conductivity-type high voltage transistor including a second conductivity-type channel, wherein the second conductivity-type high voltage transistor comprises:
   a source region and a drain region disposed on the front side surface;
   a first conductivity-type third high concentration layer disposed between the crushed layer and the source region and drain region, the first high concentration layer having a higher concentration than an impurity concentration of the semiconductor substrate; and
   a second conductivity-type fourth high concentration layer disposed between the crushed layer and the third high concentration layer.

9. The semiconductor device according to claim 8, further comprising
   a second conductivity-type second high concentration layer disposed between the crushed layer and the first high concentration layer.

10. The semiconductor device according to claim 8, wherein
    the first high concentration layer and the third high concentration layer can be simultaneously formed.

11. The semiconductor device according to claim 9, wherein
    the second high concentration layer and the fourth high concentration layer can be simultaneously formed.

12. The semiconductor device according to claim 1, further comprising:
    a second conductivity-type high voltage transistor disposed on the semiconductor substrate, the second conductivity-type high voltage transistor including a second conductivity-type channel;
    a second conductivity-type low voltage transistor disposed on the semiconductor substrate, the second conductivity-type low voltage transistor including a second conductivity-type channel; and a first conductivity-type low voltage transistor disposed on the semiconductor substrate, the first conductivity-type low voltage transistor including a first conductivity-type channel.

13. The semiconductor device according to claim 1, further comprising
a transfer transistor of which a gate is connected to the level shifter and a drain is connected to the well line connected to the semiconductor substrate, the transfer transistor configured to apply an erasing voltage to a source at a time of an erasing operation.

14. The semiconductor device according to claim 1, wherein
the memory cell array comprises a three-dimensional NAND flash memory.

15. The semiconductor device according to claim 1, wherein
a thickness of the semiconductor substrate is within a range from several micrometers to several tens of micrometers.

16. The semiconductor device according to claim 1, wherein
a center line average roughness of the crushed layer is several nanometers.

17. The semiconductor device according to claim 1, wherein
a maximum height of the crushed layer is several tens of nanometers.

18. A semiconductor memory device comprising:
a first conductivity-type semiconductor;
a memory cell array disposed on a front side surface of the semiconductor substrate; and
a first conductivity-type high voltage transistor disposed on the semiconductor substrate, the first conductivity-type high voltage transistor including a first conductivity-type channel, the first conductivity-type high voltage transistor configured to supply a high voltage to the memory cell array, wherein the first conductivity-type high voltage transistor comprises:
a well region disposed on the front side surface, the well region having a conductivity type which is a second conductivity type opposite to the first conductivity type;
a first conductivity-type source region and a first conductivity-type drain region disposed in the well region;
a first conductivity-type first high concentration layer disposed between a back side surface of the semiconductor substrate and the well region, the first high concentration layer having a higher concentration than an impurity concentration of the semiconductor substrate;
a selected block node; and
a level shifter configured to supply a high voltage to the memory cell array through the selected block node, wherein
the level shifter comprises the first conductivity-type high voltage transistor, wherein
the level shifter comprises:
a second conductivity-type second high voltage transistor comprising a source connected to a source of the first conductivity-type high voltage transistor and the well region, a drain to which a high voltage is supplied, and a gate connected to a drain of the first conductivity-type high voltage transistor and the selected block node; and
a second conductivity-type first high voltage transistor comprising a source connected to the drain of the first conductivity-type high voltage transistor and the selected block node, and a drain connected to an outside, the second conductivity-type first high voltage transistor configured to drive the second conductivity-type second high voltage transistor.

19. The semiconductor memory device according to claim 18, wherein
the first high concentration layer is in an electrically floating state.

20. The semiconductor memory device according to claim 18, wherein
a peak level of a second conductivity type impurity concentration in the well region is higher than a peak level of a first conductivity type impurity concentration of the first high concentration layer.

* * * * *